(12) United States Patent
Il et al.

(10) Patent No.: US 11,095,250 B2
(45) Date of Patent: Aug. 17, 2021

(54) CIRCUIT DEVICE, OSCILLATOR, ELECTRONIC APPARATUS, AND VEHICLE

(71) Applicant: Seiko Epson Corporation, Tokyo (JP)

(72) Inventors: Naoki Il, Suwa (JP); Takashi Nomiya, Matsumoto (JP); Mitsuaki Sawada, Fujimi (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/906,048

(22) Filed: Jun. 19, 2020

(65) Prior Publication Data

US 2020/0403570 A1  Dec. 24, 2020

(30) Foreign Application Priority Data

Jun. 21, 2019  (JP) .............................. JP2019-115201

(51) Int. Cl.
*H03B 5/04* (2006.01)
*H03B 5/32* (2006.01)
*H03L 1/02* (2006.01)
*G01K 7/01* (2006.01)

(52) U.S. Cl.
CPC .............. *H03B 5/04* (2013.01); *G01K 7/01* (2013.01); *H03B 5/32* (2013.01); *H03L 1/028* (2013.01)

(58) Field of Classification Search
CPC ... H03B 5/04; H03B 5/30; H03B 5/32; H03B 5/323; H03B 5/326; H03B 5/36; H03B 5/362; H03B 5/364; H03B 5/366; H03B 5/368; H03K 3/011; H03L 1/02; H03L 1/022; H03L 1/023; H03L 1/025; H03L 1/026; H03L 1/028
See application file for complete search history.

(56) References Cited

U.S. PATENT DOCUMENTS

| | | | | |
|---|---|---|---|---|
| 7,936,203 | B2 * | 5/2011 | Zimlich | H03L 7/0812 327/512 |
| 2006/0152294 | A1 * | 7/2006 | Kawasaki | H03B 5/36 331/176 |
| 2009/0039973 | A1 * | 2/2009 | Kitayama | H03L 7/107 331/36 C |
| 2011/0204985 | A1 * | 8/2011 | Yamada | H03H 3/02 331/156 |

(Continued)

FOREIGN PATENT DOCUMENTS

JP  2006-086783 A  3/2006
WO  2004-025824 A1  3/2004

*Primary Examiner* — Levi Gannon
(74) *Attorney, Agent, or Firm* — Harness, Dickey & Pierce, P.L.C.

(57) ABSTRACT

The circuit device includes a current generation circuit and a current-voltage conversion circuit. The current generation circuit generates a temperature compensation current based on a temperature detection voltage from the temperature sensor and temperature compensation data. The current-voltage conversion circuit converts the temperature compensation current into the temperature compensation voltage. The current generation circuit performs a fine adjustment of the temperature compensation current based on lower bits of the temperature compensation data, and performs a coarse adjustment of the temperature compensation current based on higher bits of the temperature compensation data.

13 Claims, 15 Drawing Sheets

(56) References Cited

U.S. PATENT DOCUMENTS

| | | | |
|---|---|---|---|
| 2014/0104012 A1* | 4/2014 | Zhou | H03L 1/022 331/176 |
| 2014/0218123 A1* | 8/2014 | Wei | H03B 5/04 331/176 |
| 2016/0152294 A1 | 6/2016 | Kwag et al. | |

* cited by examiner

CIRCUIT DEVICE, OSCILLATOR, ELECTRONIC APPARATUS, AND VEHICLE

The present application is based on, and claims priority from JP Application Serial Number 2019-115201, filed Jun. 21, 2019, the disclosure of which is hereby incorporated by reference herein in its entirety.

BACKGROUND

1. Technical Field

The present disclosure relates to a circuit device, an oscillator, an electronic apparatus, a vehicle, and so on.

2. Related Art

An oscillator such as a TCXO (temperature compensated crystal oscillator) is suppressed in fluctuation of the oscillation frequency by compensating the temperature characteristic of the oscillation frequency based on a detection result by the temperature sensor. Specifically, the oscillator generates a temperature compensation voltage obtained by performing polynomial approximation on the temperature characteristic of the oscillation frequency, and then compensates the oscillation frequency of the oscillation circuit based on the temperature compensation voltage. In International Publication No. WO 04/025824, there is described a temperature-compensated crystal oscillation circuit equipped with a temperature function generation circuit. The temperature function generation circuit generates a temperature function including a high-order component, and the oscillation frequency is compensated based on the temperature function. The temperature function generation circuit includes an odd function circuit, and as an example of the odd function circuit, there is described a fifth-order component generation circuit. In the fifth-order component generation circuit, a constant current is supplied from a current mirror circuit to a plurality of differential amplifiers, and reference voltages different in voltage level are supplied to the respective differential amplifiers.

Due to an individual difference of the resonator and the circuit, there is an individual difference in the temperature characteristic of the oscillation frequency. Since it is necessary to adjust parameters of the polynomial approximation in accordance with the individual difference, the temperature compensation circuit has an adjustment circuit. Although the higher the accuracy of the polynomial approximation is, the smaller the deviation of the oscillation frequency can be made, when increasing the resolution in the parameter adjustment, the circuit scale increases, and therefore, there is a problem that it is difficult to achieve both of the reduction in size of the circuit and the increase in resolution in adjustment.

SUMMARY

An aspect of the present disclosure relates to a circuit device including a current generation circuit configured to generate a temperature compensation current based on a temperature detection voltage from a temperature sensor and temperature compensation data, and a current-voltage conversion circuit configured to convert the temperature compensation current into a temperature compensation voltage, wherein the current generation circuit performs a fine adjustment of the temperature compensation current based on lower bits of the temperature compensation data, and performs a coarse adjustment of the temperature compensation current based on higher bits of the temperature compensation data.

DESCRIPTION OF AN EXEMPLARY EMBODIMENT

Hereinafter, a preferred embodiment of the present disclosure will be described in detail. It should be noted that the embodiment described hereinafter does not unreasonably limit the content of the present disclosure as set forth in the appended claims, and all of the constituents described in the present embodiment are not necessarily essential constituents.

1. Circuit Device

Figure 1:
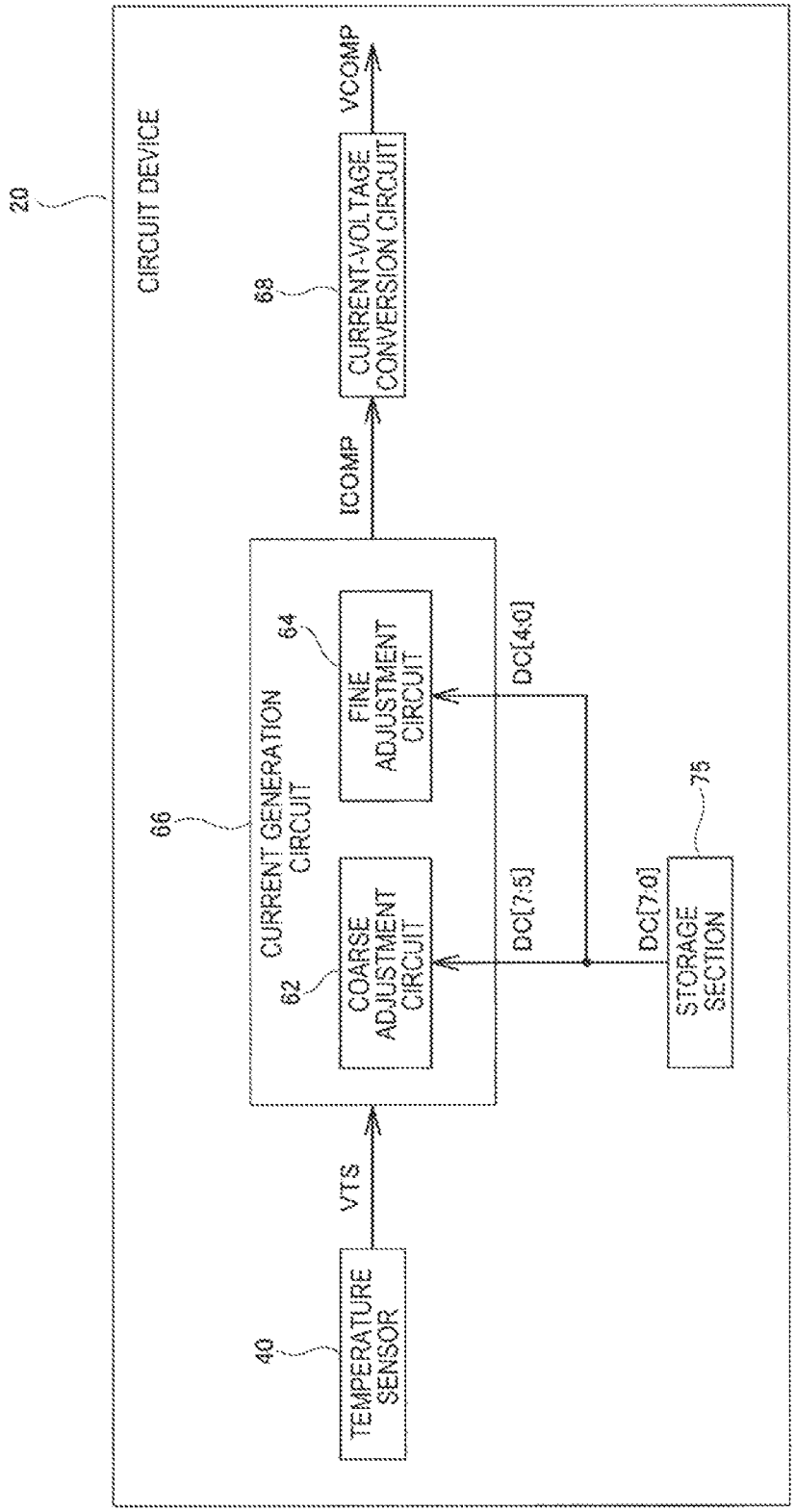
FIG. 1 is a diagram showing a first configuration example of a circuit device.

FIG. 1 shows a first configuration example of a circuit device 20. The circuit device 20 includes a temperature sensor 40, a current generation circuit 66, a current-voltage conversion circuit 68, and a storage section 75.

The current generation circuit 66 generates a temperature compensation current ICOMP based on a temperature detection voltage VTS from the temperature sensor 40 and temperature compensation data DC[7:0]. The current-voltage conversion circuit 68 converts the temperature compensation current ICOMP into a temperature compensation voltage VCOMP. On this occasion, the current generation circuit 66 performs a fine adjustment of the temperature compensation current ICOMP based on lower bits DC[4:0] of the temperature compensation data, and performs a coarse adjustment of the temperature compensation current ICOMP based on higher bits DC[7:5] of the temperature compensation data.

The temperature compensation voltage VCOMP is a voltage for performing the temperature compensation on a compensation target parameter having a temperature dependency. The temperature compensation means to suppress a change in parameter as a target of the compensation when the temperature changes. For example, when the circuit device 20 is applied to an oscillator, the temperature compensation voltage VCOMP is a voltage for performing the temperature compensation on the oscillation frequency of the oscillator. The coarse adjustment means an adjustment having lower resolution than the resolution of the overall adjustment including the fine adjustment. The fine adjustment means an adjustment performed dividing an adjustment step in the coarse adjustment into a plurality of finer adjustment steps.

The temperature compensation data DC[7:0] is the data for setting the temperature characteristic of the temperature compensation voltage VCOMP. Specifically, the temperature compensation data DC[7:0] is used to set what characteristic is provided to the temperature compensation current ICOMP generated by the current generation circuit 66 with respect to the temperature detection voltage VTS. The temperature compensation data DC[7:0] is stored in the storage section 75. The temperature dependency of the compensation target parameter is measured in advance at the time of manufacture and so on, then the temperature compensation data DC[7:0] corresponding to the temperature dependency is decided, and then the temperature compensation data DC[7:0] is written in the storage section 75. For example, the storage section 75 is a nonvolatile memory, and the temperature compensation data DC[7:0] is stored in the nonvolatile memory at the time of manufacture. Alternatively, the storage section 75 can also be a RAM or a register, and it is also possible to write the temperature compensation data DC[7:0] into the RAM or the register from the host or the like in a normal operation of the circuit device 20.

The current generation circuit 66 includes a coarse adjustment circuit 62 for performing the coarse adjustment of the temperature compensation current ICOMP based on the higher bits DC[7:5], and a fine adjustment circuit 64 for performing the fine adjustment of the temperature compensation current ICOMP based on the lower bits DC[4:0]. The current generation circuit 66 generates the temperature compensation current ICOMP with the polynomial approximation using the temperature detection voltage VTS as a parameter. The polynomial includes a zero-order term, a first-order term, and a high-order term, and among these, the first-order correction and the high-order correction are performed by the current generation circuit 66. The high order means, for example, third order, and can further include fourth or higher order. As described later, the current generation circuit 66 includes current generation circuits of a linear function and a high-order function, and the coarse adjustment circuit and the fine adjustment circuit are disposed to each of the current generation circuits for the respective orders. Here, those are collectively referred to as the coarse adjustment circuit 62 and the fine adjustment circuit 64.

According to the present embodiment, since the adjustment of the temperature compensation current ICOMP based on the temperature compensation data DC[7:0] is separated into the coarse adjustment based on the higher bits DC[7:5] and the fine adjustment based on the lower bits DC[4:0], it is possible to achieve both of reduction in size of the circuit and high resolution of the adjustment. In other words, by separating the coarse adjustment and the fine adjustment from each other, it is possible to achieve the high resolution by the fine adjustment circuit 64 while making the coarse adjustment circuit 62 compact. Further, since the coarse adjustment circuit 62 and the fine adjustment circuit 64 can be made different in circuit configuration from each other, it is possible to configure the fine adjustment circuit 64 more advantageous in terms of the layout area than the coarse adjustment circuit 62.

Specifically, in order to perform the coarse adjustment of the temperature compensation current ICOMP, the coarse adjustment circuit 62 is disposed in the channel through which the function current of each of the orders flows in the current generation circuit 66. Since the transistor disposed in the channel through which the current flows generates a 1/f noise, it is necessary to increase the area of the gate of the transistor in order to reduce the 1/f noise. Since the larger the number of the bits of the adjustment, the larger the number of the transistors becomes, it is necessary to dispose a number of transistors large in gate area. In the present embodiment, the number of bits is reduced to 3 since the coarse adjustment based on the higher bits DC[7:5] is performed, and thus, the circuit area can significantly be reduced.

On the other hand, since the fine adjustment circuit 64 is disposed, the resolution of the adjustment can be ensured. Since it is not required in the fine adjustment to adjust the current in a large amplitude, it is possible to dispose the fine adjustment circuit 64 in the channel through which no current flows in the current generation circuit 66. Specifically, as described later, the fine adjustment can be realized using a back gate voltage adjustment of the transistor. Since the 1/f noise does not occur in the channel through which no current flows, it is not required to increase the area of the circuit element, and thus, the layout area can be suppressed compared to the coarse adjustment circuit 62.

It should be noted that although in FIG. 1, the circuit device 20 includes the temperature sensor 40, this is not a limitation, and the temperature sensor 40 can be disposed outside the circuit device 20. In this case, the temperature detection voltage VTS is input from the temperature sensor 40 to the circuit device 20. Further, although in FIG. 1, the temperature compensation data is expressed in 8 bits, this is not a limitation, and it is sufficient for the temperature compensation data to be expressed in 2 or more bits. Further, in FIG. 1, the number of the higher bits of the temperature compensation data is 3, and the number of the lower bits is 5, but this is not a limitation, and the numbers of the bits to be assigned to the higher bits and the lower bits can be arbitrary.

2. Detailed Configuration Example of Circuit Device

Figure 2:
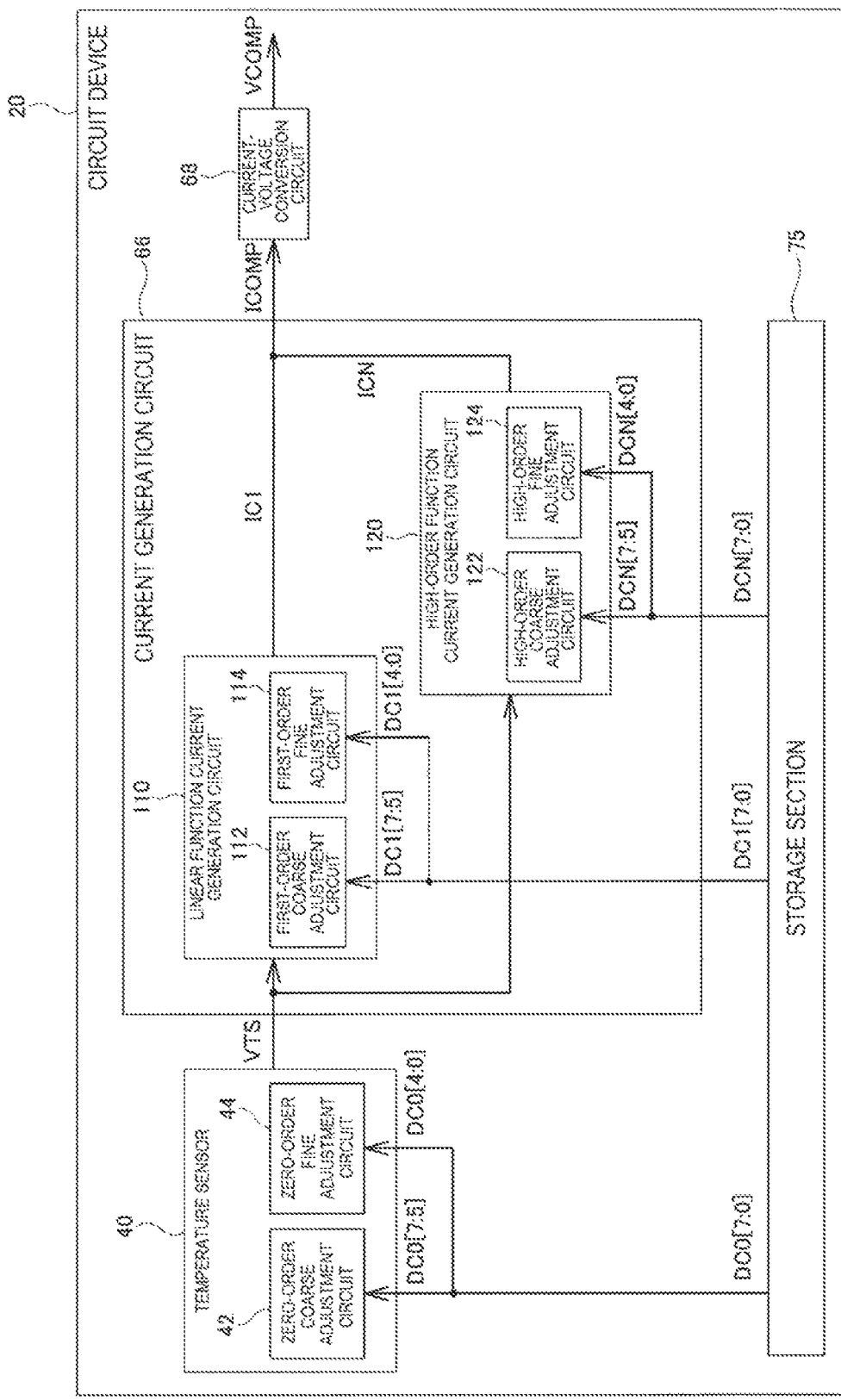
FIG. 2 is a diagram showing a first detailed configuration example of the circuit device.

FIG. 2 shows a first detailed configuration example of the circuit device 20. It should be noted that the same constituents as the constituents having already been described are denoted by the same reference numerals, and the description of such constituents will arbitrarily be omitted.

As shown in FIG. 2 the current generation circuit includes a linear function current generation circuit 110 for generating a linear function current IC1, and a high-order function current generation circuit 120 for generating a high-order function current ICN. A current obtained by adding the linear function current IC1 and the high-order function current ICN to each other corresponds the temperature compensation current ICOMP.

The high-order function current generation circuit 120 generates the high-order function current ICN, namely second or higher-order function current, based on the temperature detection voltage VTS and the high-order correction data DCN[7:0] of the temperature compensation data. The high-order function current generation circuit 120 performs the fine adjustment of the high-order function current ICN based on high-order lower bits DCN[4:0] as the lower bits of the high-order correction data. Further, the high-order function current generation circuit 120 performs the coarse adjustment of the high-order function current ICN based on high-order higher bits DCN[7:5] as the higher bits of the high-order correction data.

Specifically, the storage section 75 stores the high-order correction data DCN[7:0], and outputs the high-order correction data DCN[7:0] to the high-order function current generation circuit 120. The high-order function current generation circuit 120 includes a high-order coarse adjustment circuit 122 for performing the coarse adjustment of the high-order function current ICN based on the high-order higher bits DCN[7:5], and a high-order fine adjustment circuit 124 for performing the fine adjustment of the high-order function current ICN based on the high-order lower bits DCN[4:0]. The high-order function current ICN is a current approximating a second or higher-order term of the polynomial with respect to the temperature. The high-order function is, for example, a third-order term in the polynomial, but is not limited thereto, and is only required to be a second or higher-order term in the polynomial.

The linear function current generation circuit 110 generates a linear function current IC1 based on the temperature detection voltage VTS and the first-order correction data DC1[7:0] of the temperature compensation data. The linear function current generation circuit 110 performs the fine adjustment of the linear function current IC1 based on first-order lower bits DC1[4:0] as the lower bits of the first-order correction data. Further, the linear function current generation circuit 110 performs the coarse adjustment of the linear function current IC1 based on first-order higher bits DC1[7:5] as the higher bits of the first-order correction data.

Specifically, the storage section 75 stores the first-order correction data DC1[7:0], and outputs the first-order correction data DC1[7:0] to the linear function current generation circuit 110. The linear function current generation circuit 110 includes a first-order coarse adjustment circuit 112 for performing the coarse adjustment of the linear function current IC1 based on the first-order higher bits DC1[7:5], and a first-order fine adjustment circuit 114 for performing the fine adjustment of the linear function current IC1 based on the first-order lower bits DC1[4:0]. The linear function current IC1 is a current approximating the first-order term of the polynomial with respect to the temperature.

According to the present embodiment, each of the adjustment of the linear function current IC1 and the adjustment of the high-order function current ICN is separated into the coarse adjustment and the fine adjustment. Thus, it is possible to achieve both of the reduction in size of the circuit and the high resolution of the adjustment in both of the linear function current generation circuit 110 and the high-order function current generation circuit 120. In other words, since the coarse adjustment and the fine adjustment are separated from each other in each of the first-order section and the high-order section, it is possible to achieve the high resolution due to the fine adjustment circuit while making the coarse adjustment circuit compact in each of the first-order section and the high-order section. Further, it is possible to make each of the coarse adjustment circuit and the fine adjustment circuit have appropriate circuit configuration in each of the first-order section and the high-order section.

It should be noted that in FIG. 2, the coarse adjustment corresponds to 3 bits, and the fine adjustment corresponds to 5 bits in each of the first-order section and the high-order section, but this is not a limitation, and the number of bits of each of the coarse adjustment and the fine adjustment can be different between the first-order section and the high-order section. Further, in FIG. 2, the first-order correction data and the high-order correction data are each expressed in 8 bits, but this is not a limitation, and it is sufficient for each of the first-order correction data and the high-order correction data to be expressed in 2 or more bits, and further, the first-order correction data and the high-order correction data can be expressed in different number of bits from each other.

Further, although in FIG. 2, there is disposed the single high-order function current generation circuit 120, this is not a limitation, and it is possible for the current generation circuit 66 to include, for example, a cubic function current generation circuit, a quartic function current generation circuit, and a quintic function current generation circuit. In this case, it is also possible to provide the coarse adjustment circuit and the fine adjustment circuit to each of the current generation circuits of the respective orders. Further, the quartic function current generation circuit and the quintic function current generation circuit can be configured as a combined circuit. In this case, it is possible for the quartic function current generation circuit and the quintic function current generation circuit to have a set of the coarse adjustment circuit and the fine adjustment circuit, and it is possible for the coarse adjustment circuit and the fine adjustment circuit to perform the adjustment of the current obtained by adding the quartic function current and the quintic function current to each other.

The temperature sensor 40 outputs the temperature detection voltage VTS based on the zero-order correction data DC0[7:0] of the temperature compensation data. The temperature sensor 40 performs the coarse adjustment of an offset of the temperature detection voltage VTS based on zero-order higher bits DC0[7:5] as the higher bits of the zero-order correction data. Further, the temperature sensor performs the fine adjustment of the offset of the temperature detection voltage VTS based on zero-order lower bits DC0[4:0] as the lower bits of the zero-order correction data.

Specifically, the storage section 75 stores the zero-order correction data DC0[7:0], and outputs the zero-order correction data DC0[7:0] to the temperature sensor 40. The temperature sensor 40 includes a zero-order coarse adjustment circuit 42 for performing the coarse adjustment of the offset of the temperature detection voltage VTS based on the zero-order higher bits DC0[7:5], and a zero-order fine adjustment circuit 44 for performing the fine adjustment of the offset of the temperature detection voltage VTS based on the zero-order lower bits DC0[4:0]. The temperature detection voltage VTS is a voltage approximating the zero-order term and the first-order term with respect to the temperature. The zero-order correction data DC0[7:0] is the data for adjusting the offset as the zero-order term of the temperature detection voltage VTS.

According to the present embodiment, the offset adjustment of the temperature detection voltage VTS is separated into the coarse adjustment and the fine adjustment. Thus, it is possible to achieve both of the reduction in size of the circuit for adjusting the offset of the temperature detection voltage VTS and the high resolution of the adjustment. In other words, in the offset adjustment of the temperature detection voltage VTS, by separating the coarse adjustment and the fine adjustment from each other, it is possible to achieve the high resolution by the zero-order fine adjustment circuit 44 while making the zero-order coarse adjustment circuit 42 compact. Further, by separating the coarse adjustment and the fine adjustment from each other, it is possible to provide the zero-order coarse adjustment circuit 42 and the zero-order fine adjustment circuit 44 with an appropriate circuit configuration.

Specifically, in order to perform the coarse adjustment of the offset of the temperature detection voltage VTS, the zero-order coarse adjustment circuit 42 is disposed in the channel through which the current flows in the temperature sensor 40. Since the transistor disposed in the channel through which the current flows generates a 1/f noise, it is necessary to increase the area of the gate of the transistor in order to reduce the 1/f noise. In the present embodiment, the number of bits is reduced to 3 since the coarse adjustment based on the zero-order higher bits DC0[7:5] is performed, and thus, the circuit area can significantly be reduced.

On the other hand, since the zero-order fine adjustment circuit 44 is disposed, the resolution of the adjustment can be ensured. Since it is not required in the fine adjustment to adjust the current in a large amplitude, it is possible to dispose the zero-order fine adjustment circuit 44 in the channel through which no current flows in the temperature sensor 40. Since the 1/f noise does not occur in the channel through which no current flows, it is not required to increase the area of the circuit element, and thus, the layout area can be suppressed compared to the coarse adjustment circuit.

It should be noted that although in FIG. 2, the zero-order correction data is expressed in 8 bits, this is not a limitation, and it is sufficient for the zero-order correction data to be expressed in 2 or more bits. Further, in FIG. 2, the number of the higher bits of the zero-order correction data is 3, and the number of the lower bits is 5, but this is not a limitation, and the numbers of the bits to be assigned to the higher bits and the lower bits can be arbitrary.

3. High-Order Function Current Generation Circuit

Figure 3:
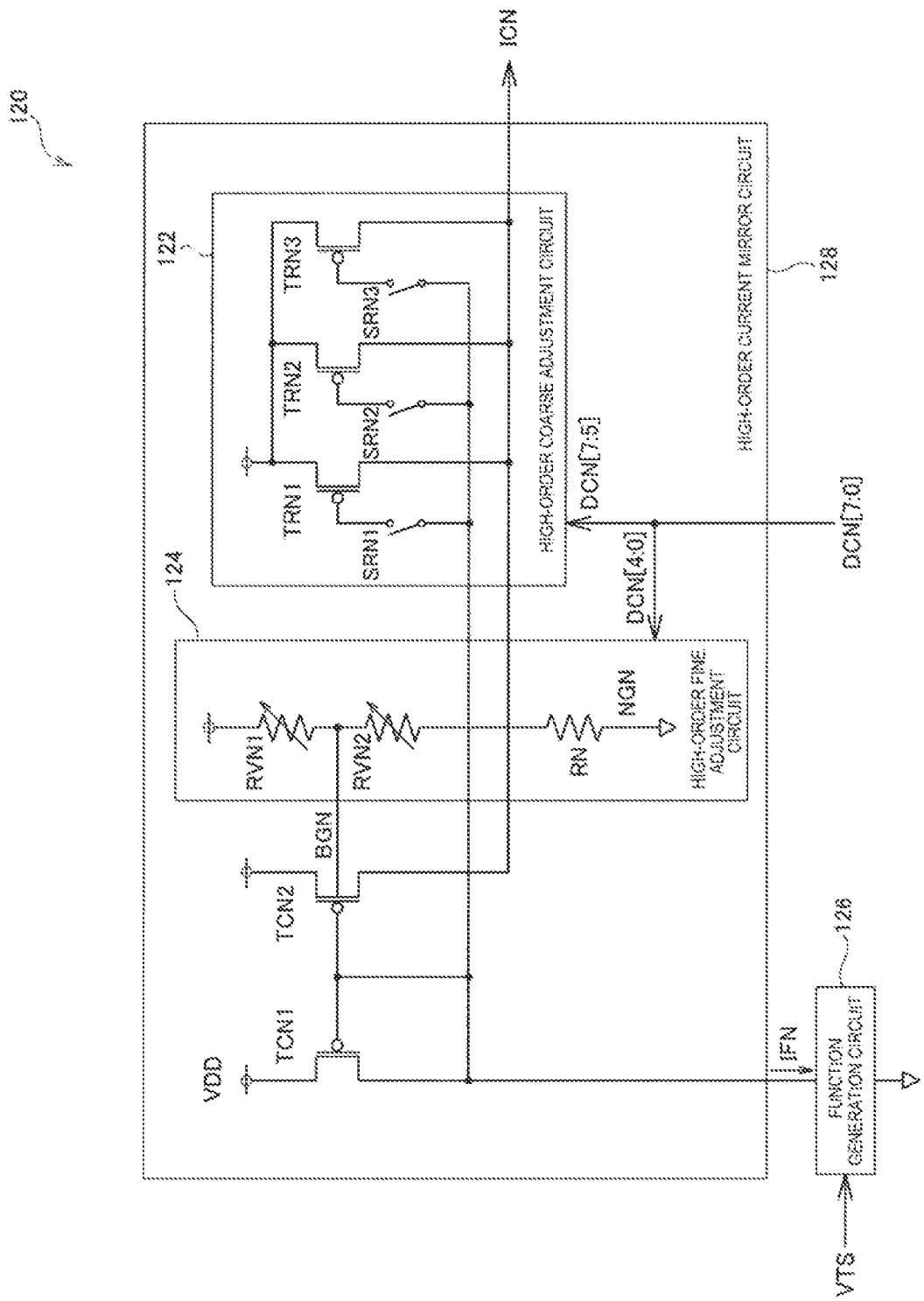
FIG. 3 is a diagram showing a first detailed configuration example of a high-order function current generation circuit.

FIG. 3 shows a first detailed configuration example of the high-order function current generation circuit 120. A function generation circuit 126 and a high-order current mirror circuit 128 are included.

The function generation circuit 126 generates a mirror input function current IFN as a current approximating the function with respect to the temperature based on the temperature detection voltage VTS. The mirror input function current IFN is a current approximating the second or higher-order term of the polynomial with respect to the temperature, and is a current on which the adjustment based on the temperature compensation data has not yet been performed. The detailed configuration of the function generation circuit 126 will be described later.

The high-order current mirror circuit 128 mirrors the mirror input function current IFN to thereby output the high-order function current ICN. On this occasion, the high-order current mirror circuit 128 adjusts a current mirror ratio based on the high-order correction data DCN[7:0] to thereby adjust the high-order function current ICN. The high-order current mirror circuit 128 includes a transistor TCN1 as a first high-order transistor, a transistor TCN2 as a second high-order transistor, the high-order coarse adjustment circuit 122, and the high-order fine adjustment circuit 124. A current obtained by adding a drain current of the transistor TCN2 and the output current of the high-order coarse adjustment circuit 122 to each other corresponds to the high-order function current ICN.

The mirror input function current IFN flows through the transistor TCN1. The transistor TCN2 mirrors the mirror input function current IFN flowing through the transistor TCN1. Specifically, the transistors TCN1 and TCN2 are each a P-type transistor. The source of each of the transistors TCN1 and TCN2 is coupled to a power supply node. The power supply node is a node to which the power supply VDD is supplied. The gate and the drain of the transistor TCN1 are commonly coupled to an output node of the function generation circuit 126 and the gate of the transistor TCN2. The drain of the transistor TCN2 is coupled to an output node of the high-order function current generation circuit 120.

It should be noted that the coupling in the present embodiment is electrical coupling. The electrical coupling means coupling capable of transmitting an electrical signal, and is coupling with which transmission of information by the electrical signal is achievable. The electrical coupling can also be coupling via an active element or the like.

The high-order fine adjustment circuit 124 adjusts a back gate voltage BGN of the transistor TCN2 based on the high-order lower bits DCN[4:0] to thereby adjust the current mirror ratio of the transistor TCN2. The high-order fine adjustment circuit 124 is a voltage generation circuit for generating the back gate voltage BGN. Specifically, the high-order fine adjustment circuit 124 includes variable resistive circuits RVN1, RVN2 and a resistor RN. The variable resistive circuit RVN1 is coupled between the power supply node and the back gate of the transistor TCN2. The variable resistive circuit RVN2 and the resistor RN are coupled in series to each other between the back gate of the transistor TCN2 and a ground node NGN. A divisional voltage output between the variable resistive circuits RVN1 and RVN2 is input to the back gate of the transistor TCN2 as the back gate voltage BGN.

The resistance values of the variable resistive circuits RVN1, RVN2 are variably set by the high-order lower bits DCN[4:0], and thus, the back gate voltage BGN is variably set. The variable resistive circuit RVN1 includes a plurality of resistors coupled in series to each other and a plurality of switches. A switch is coupled in parallel to each of the resistors. These switches correspond to the plurality of switches described above. By each of the switches being set to the on state or the off state in accordance with the high-order lower bits DCN[4:0], the resistance value of the variable resistive circuit RVN1 is set. The same applies to the configuration of the variable resistive circuit RVN2.

Figure 4:
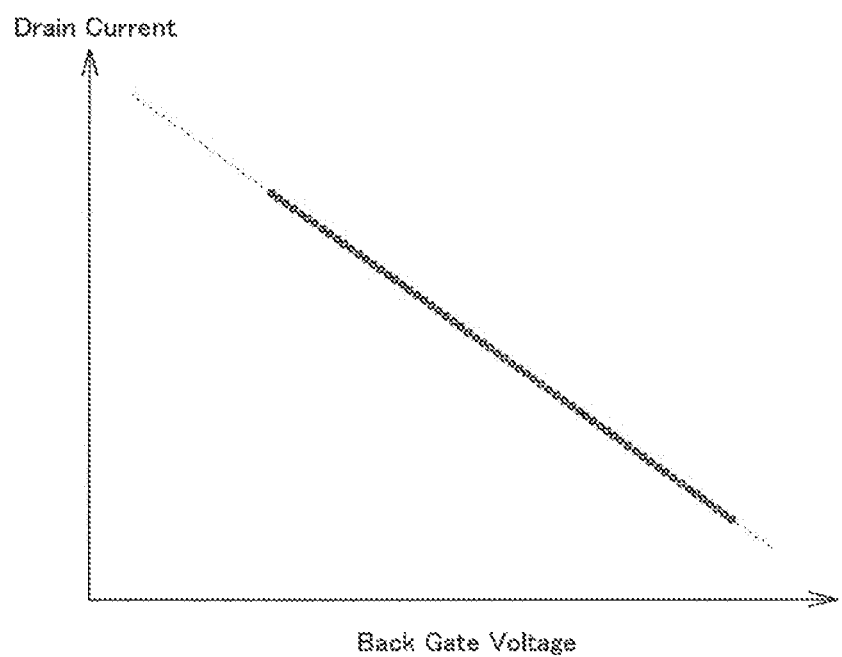
FIG. 4 is a diagram showing a characteristic of a drain current of a transistor with respect to a back gate voltage.

FIG. 4 is a diagram showing a characteristic of a drain current of the transistor TCN2 with respect to the back gate voltage BGN. In FIG. 4, the plurality of dots represents a simulation result with respect to the respective values of the high-order lower bits DCN[4:0], and the dotted line is a line obtained by performing the straight-line approximation on the simulation result.

The high-order fine adjustment circuit 124 generates the back gate voltages BGN at regular intervals with respect to the gray levels of the high-order lower bits DCN[4:0]. As shown in FIG. 4, the drain current of the transistor TCN2 linearly changes with respect to the back gate voltage BGN. Therefore, the drain current of the transistor TCN2 has values at regular intervals with respect to the gray levels of the high-order lower bits DCN[4:0].

According to the present embodiment, by the high-order fine adjustment circuit 124 adjusting the back gate voltage BGN based on the high-order lower bits DCN[4:0], it is possible to perform the fine adjustment of the high-order function current ICN in accordance with the high-order lower bits DCN[4:0].

Then, the high-order coarse adjustment circuit 122 will be described. The high-order coarse adjustment circuit 122 mirrors the mirror input function current IFN flowing through the transistor TCN1 at the current mirror ratio based on the high-order higher bits DCN[7:5].

Specifically, the high-order coarse adjustment circuit 122 includes transistors TRN1 though TRN3 as first through third coarse adjusting transistors, and switches SRN1 through SRN3 as first through third coarse adjusting switches. The switches SRN1 through SRN3 are disposed between the gates of the transistors TRN1 through TRN3 and the gate of the transistor TCN1, respectively. The transistors TRN1 through TRN3 are each a P-type transistor in which the source is coupled to the power supply node, and the drain is coupled to the output node of the high-order function current generation circuit 120. The gates of the transistors TRN1 through TRN3 are respectively coupled to one ends of the switches SRN1 through SRN3. The other ends of the switches SRN1 through SRN3 are commonly coupled to the gate of the transistor TCN1.

The transistors TRN1 through TRN3 are constituted by unit transistors. For example, assuming that the number of the unit transistors in the transistor TRN1 is 1, the numbers of the unit transistors in the transistors TRN2, TRN3 are 2, 4, respectively. Further, the transistors TCN1, TCN2 are also constituted by the unit transistors, and the numbers of the unit transistors are 4, 2, respectively.

The switches SRN1, SRN2, and SRN3 are set to the on state or the off state in accordance with DCN[5], DCN[6], and DCN[7], respectively. The transistors TRN1, TRN2, and TRN3 mirror the mirror input function current IFN when the switches SRN1, SRN2, and SRN3 are in the on state, respectively. Since the mirror ratio is decided by the ratio of the numbers of the unit transistors, the mirror ratio of the high-order coarse adjustment circuit 122 as a whole is proportional to the value of the high-order higher bits DCN[7:5] as a result.

Figure 5:
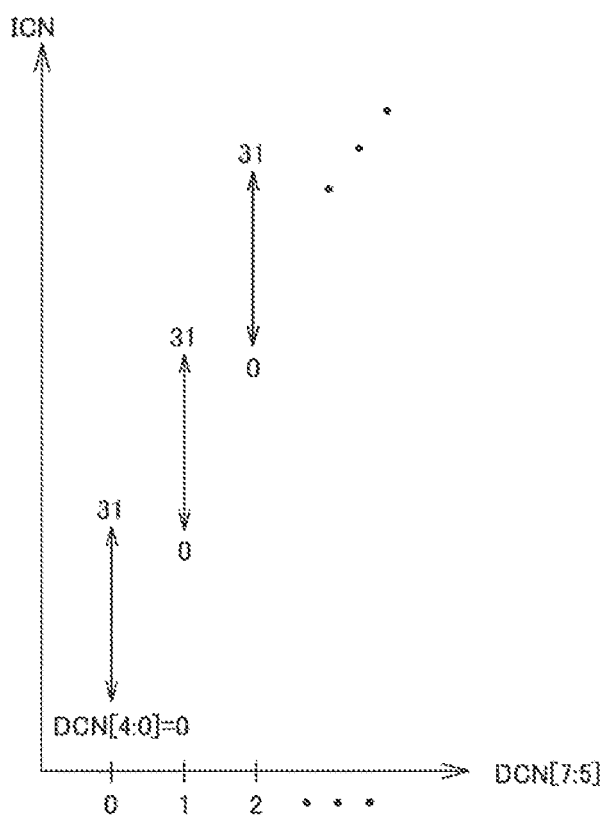
FIG. 5 is a diagram showing a characteristic of a high-order function current with respect to high-order correction data.
Figure 8:
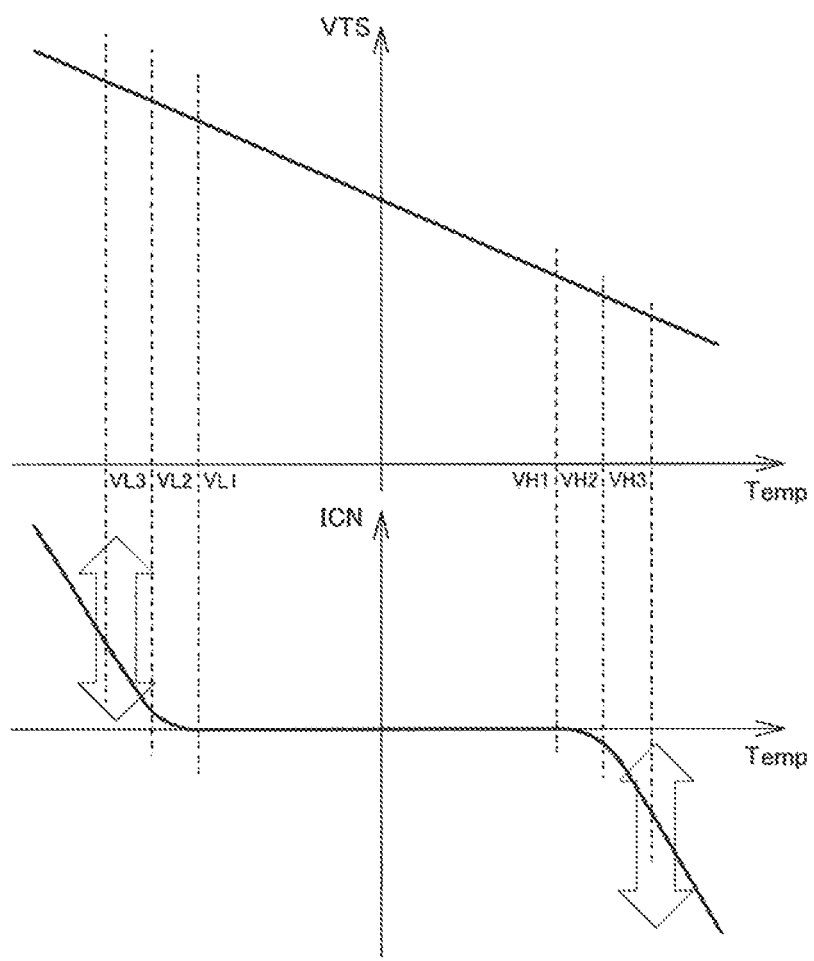
FIG. 8 is a diagram for explaining an adjustment of the high-order function current.

FIG. 5 shows the characteristic of the high-order function current ICN with respect to the high-order correction data DCN[7:0]. In FIG. 5, the horizontal axis represents the high-order higher bits DCN[7:5], and the vertical axis represents the high-order function current ICN at an arbitrary fixed temperature. As shown in FIG. 8, the high-order function current ICN fulfills ICN≠0 at a low temperature or a high temperature. It is sufficient for the arbitrary fixed temperature to be a temperature at which ICN≠0 is fulfilled.

When the value of the high-order lower bits DCN[4:0] equals 0, the high-order function current ICN increases as the value of the high-order higher bits DCN[7:5] increases as 0, 1, 2, This corresponds to the coarse adjustment of the high-order function current ICN, and in the fine adjustment, each of the steps in the coarse adjustment is further divided into smaller steps for performing the adjustment. In FIG. 5, the changes in the high-order function current ICN with respect to the high-order lower bits DCN[4:0] are represented by the arrows. The value of the high-order function current ICN between the point (DCN[7:5],DCN[4:0])=(0,0) and the point (DCN[7:5],DCN[4:0])=(1,0) is divided into 32 gray levels equal in difference to each other represented by the high-order lower bits DCN[4:0]. The following coarse adjustment steps are each divided into the 32 gray levels. It should be noted that the adjustment range by the fine adjustment can overlap the adjustment range adjacent thereto. For example, the adjustment range of the fine adjustment when the high-order higher bits DCN[7:5] equals 0 and the adjustment range of the fine adjustment when the high-order higher bits DCN[7:5] equals 1 can overlap each other.

According to the present embodiment, by the high-order coarse adjustment circuit 122 mirroring the mirror input function current IFN at the current mirror ratio based on the high-order higher bits DCN[7:5], it is possible to perform the coarse adjustment of the high-order function current ICN in accordance with the high-order higher bits DCN[7:5].

Assuming that the entire adjustment with the high-order correction data DCN[7:0] is performed using substantially the same configuration as the high-order coarse adjustment circuit 122 without providing the high-order fine adjustment circuit 124, the transistors corresponding to the 8 bits for mirroring the mirror input function current IFN are necessary. The eight transistors are respectively constituted by 1 unit transistor, 2 unit transistors, 4 unit transistors, . . . , and 128 unit transistors. Further, the numbers of unit transistors constituting the transistors TCN1, TCN2 are 128, 64, respectively. As described above, when the adjustment is not divided into the coarse adjustment and the fine adjustment, the number of the unit transistors becomes extremely large. Since the unit transistors are disposed in the channel through which the high-order function current ICN flows, there is required a large gate area in order to reduce the 1/f noise. Therefore, the large layout area becomes necessary when the number of the unit transistor is large. In the present embodiment, since the coarse adjustment and the fine adjustment are separated from each other, it is possible to dramatically reduce the unit transistors, and thus, it is possible to reduce the layout area. Further, the high-order fine adjustment circuit 124 supplies the back gate voltage BGN to the back gate through which no current flows. Thus, since the circuit elements small in area can be used for the variable resistive circuits RVN1, RVN2, it is possible to achieve the high-resolution adjustment while suppressing the layout area.

It should be noted that although in FIG. 3, the high-order coarse adjustment circuit 122 includes the first through third coarse adjusting transistors and the first through third coarse adjusting switches, this is not a limitation, and it is sufficient for the high-order coarse adjustment circuit 122 to include the first through n-th coarse adjusting transistors and the first through n-th coarse adjusting switches. The reference symbol n denotes an integer equal to or greater than 2. For example, when the first through n-th coarse adjusting transistors are binary-weighted, the integer n is the same as the number of the high-order higher bits.

Figure 6:
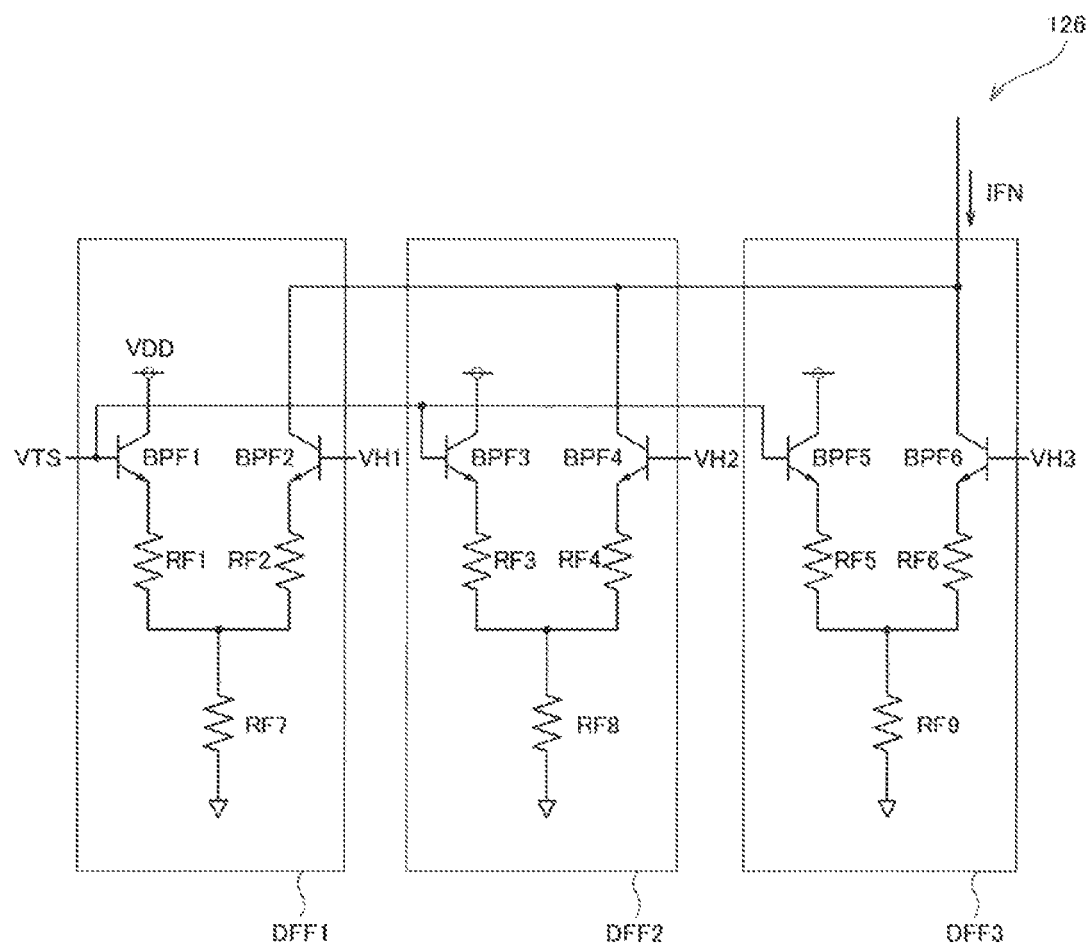
FIG. 6 is a diagram showing a detailed configuration example of a function generation circuit.

FIG. 6 shows a detailed configuration example of the function generation circuit 126. It should be noted that in FIG. 6, there is described an example in which the function generation circuit 126 generates a cubic function current approximating the third-order term of the polynomial.

As shown in FIG. 6, the function generation circuit 126 includes differential sections DFF1 through DFF3. The differential section DFF1 includes bipolar transistors BPF1, BPF2 and resistors RF1, RF2, and RF7. The differential section DFF2 includes bipolar transistors BPF3, BPF4 and resistors RF3, RF4, and RF8. The differential section DFF3 includes bipolar transistors BPF5, BPF6 and resistors RF5, RF6, and RF9.

In the differential section DFF1, the bipolar transistors BPF1, BPF2 constitute a differential pair. Specifically, the temperature detection voltage VTS and the reference voltage VH1 are respectively input to the base of the bipolar transistor BPF1, and the base of the bipolar transistor BPF2. The collector of the bipolar transistor BPF1 and the collector of the bipolar transistor BPF2 are respectively coupled to the power supply node and the output node of the function generation circuit 126. The emitter of the bipolar transistor BPF1 and the emitter of the bipolar transistor BPF2 are respectively coupled to one ends of the resistors RF1, RF2. The other ends of the resistors RF1, RF2 are coupled to one end of the resistor RF7, and the other end of the resistor RF7 is coupled to the ground node.

The configuration of each of the differential sections DFF2, DFF3 is substantially the same as the configuration of the differential section DFF1. It should be noted that the reference voltages VH2, VH3 are respectively input to the base of the bipolar transistor BPF4, and the base of the bipolar transistor BPF6. The reference voltages VH1 through VH3 are voltages different from each other, and fulfill a relationship of VH1>VH2>VH3.

In the differential section DFF1, the collector current of the bipolar transistor BPF2 is zero when VTS<<VH1 is true, and starts to flow in the vicinity of VTS=VH1. When VTS>VH1 is true, the higher the temperature detection voltage VTS is, the more the collector current of the bipolar transistor BPF2 increases. The collector current of the bipolar transistor BPF4 and the collector current of the bipolar transistor BPF6 in the respective differential sections DFF2, DFF3 have substantially the same characteristic around the reference voltages VH2, VH3, respectively. The current obtained by adding the collector current of the bipolar transistor BPF2, the collector current of the bipolar transistor BPF4, and the collector current of the bipolar transistor BPF6 to each other is output as the mirror input function current IFN.

Figure 7:
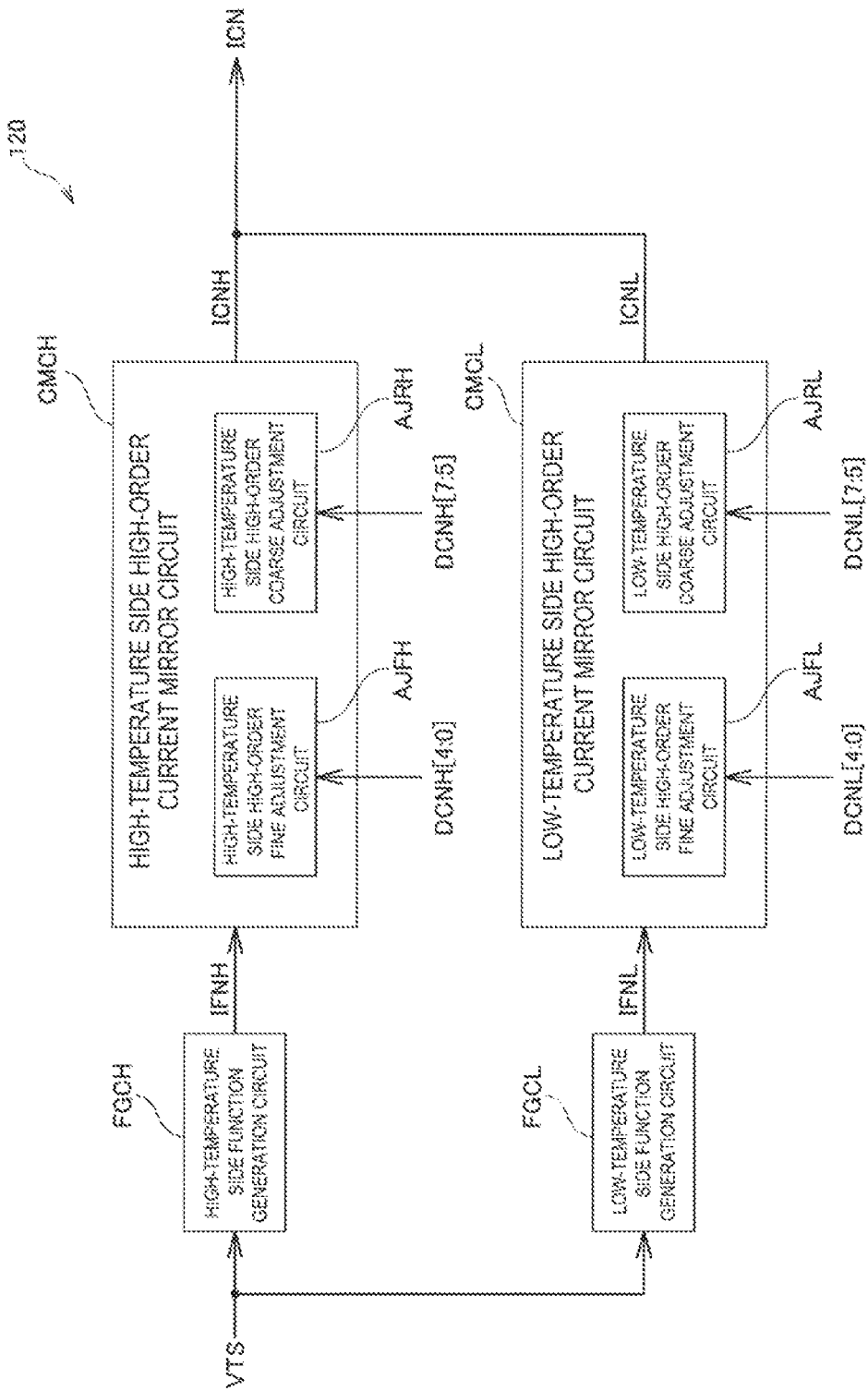
FIG. 7 is a diagram showing a second detailed configuration example of the high-order function current generation circuit.

FIG. 7 shows a second detailed configuration example of the high-order function current generation circuit 120. The high-order function current generation circuit 120 includes a high-temperature side function generation circuit FGCH, a high-temperature side high-order current mirror circuit CMCH, a low-temperature side function generation circuit FGCL, and a low-temperature side high-order current mirror circuit CMCL.

The high-temperature side function generation circuit FGCH generates a high-temperature side mirror input function current IFNH as a current approximating the function with respect to the temperature higher than the reference temperature based on the temperature detection voltage VTS. The reference temperature is, for example, the room temperature of 25 degrees, but is not limited thereto, and can also be an arbitrary temperature. The high-temperature side high-order current mirror circuit CMCH mirrors the high-temperature side mirror input function current IFNH at the current mirror ratio based on high-temperature side high-order correction data DCNH[7:0] to thereby output a high-temperature side high-order function current ICNH. The high-temperature side high-order current mirror circuit CMCH includes a high-temperature side high-order fine adjustment circuit AJFH for performing the fine adjustment of the high-temperature side high-order function current ICNH based on the lower bits DCNH[4:0], and a high-temperature side high-order coarse adjustment circuit AJRH for performing the coarse adjustment of the high-temperature side high-order function current ICNH based on the higher bits DCNH[7:5].

The high-temperature side function generation circuit FGCH, the high-temperature side high-order current mirror circuit CMCH, the high-temperature side high-order fine adjustment circuit AJFH, and the high-temperature side high-order coarse adjustment circuit AJRH respectively have substantially the same configurations as those of the function generation circuit 126, the high-order current mirror circuit 128, the high-order fine adjustment circuit 124, and the high-order coarse adjustment circuit 122 described with reference to FIG. 3 and FIG. 6.

The low-temperature side function generation circuit FGCL generates a low-temperature side mirror input function current IFNL as a current approximating the function with respect to the temperature lower than the reference temperature based on the temperature detection voltage VTS. The low-temperature side high-order current mirror circuit CMCL mirrors the low-temperature side mirror input function current IFNL at the current mirror ratio based on low-temperature side high-order correction data DCNL[7:0] to thereby output a low-temperature side high-order function current ICNL. The low-temperature side high-order current mirror circuit CMCL includes a low-temperature side high-order fine adjustment circuit AJFL for performing the fine adjustment of the low-temperature side high-order function current ICNL based on the lower bits DCNL[4:0], and a low-temperature side high-order coarse adjustment circuit AJRL for performing the coarse adjustment of the low-temperature side high-order function current ICNL based on the higher bits DCNL[7:5]. A current obtained by adding the high-temperature side high-order function current ICNH and the low-temperature side high-order function current ICNL to each other corresponds to the high-order function current ICN.

The low-temperature side high-order current mirror circuit CMCL, the low-temperature side high-order fine adjustment circuit AJFL, and the low-temperature side high-order coarse adjustment circuit AJRL respectively have substantially the same configurations as those of the high-order current mirror circuit 128, the high-order fine adjustment circuit 124, and the high-order coarse adjustment circuit 122 described with reference to FIG. 3. The low-temperature side function generation circuit FGCL has a configuration obtained by reversing the polarity of the function generation circuit 126 described with reference to FIG. 6. Specifically, it is sufficient to input reference voltages VL1 through VL3 respectively to the base of the bipolar transistor BPF1, the base of the bipolar transistor BPF3, the base of the bipolar transistor BPF5, and input the temperature detection voltage VTS to the base of each of the bipolar transistors BPF2, BPF4, and BPF6 in FIG. 6. The reference voltages VL1 through VL3 are voltages different from each other, and fulfill a relationship of VL3>VL2>VL1. Further, VL1>VH1 is fulfilled.

FIG. 8 is a diagram for explaining the adjustment of the high-order function current ICN. FIG. 8 shows the characteristic of the temperature detection voltage VTS and the high-order function current ICN with respect to the temperature.

The temperature detection voltage VTS changes linearly with respect to the temperature, and has a negative gradient with respect to the temperature. In other words, when the temperature rises, the temperature detection voltage VTS drops. On the high-temperature side where the temperature is higher than the reference temperature, when the temperature detection voltage VTS continues to drop, the negative high-order function current ICN starts to flow in the vicinity of VTS=VH1. Subsequently, as the temperature rises, the negative current which starts to flow in the vicinity of VTS=VH2, and the negative current which starts to flow in the vicinity of VTS=VH3 are added to the high-order function current ICN. On the low-temperature side where the temperature is lower than the reference temperature, when the temperature detection voltage VTS continues to rise, the positive high-order function current ICN starts to flow in the vicinity of VTS=VL1. Subsequently, as the temperature drops, the positive current which starts to flow in the vicinity of VTS=VL2, and the positive current which starts to flow in the vicinity of VTS=VL3 are added to the high-order function current ICN. In such a manner, the high-order function current ICN approximating the third-order term of the polynomial is generated.

As indicated by the arrows in FIG. 8, the adjustment based on the high-order correction data DCN[7:0] corresponds to a gain adjustment when generating the high-order function current ICN from the mirror input function current IFN. This adjustment corresponds to a coefficient to be multiplied by the third-order term of the polynomial having the temperature as a parameter. It should be noted that in the configuration example shown in FIG. 7, it is possible to adjust the current mirror ratio on the high-temperature side and the current mirror ratio on the low-temperature side respectively with the correction data DCNH[7:0], DCNL[7:0] independent of each other. In other words, the coefficient to be multiplied by the third-order term can independently be set on the high-temperature side and on the low-temperature side.

Figure 9:
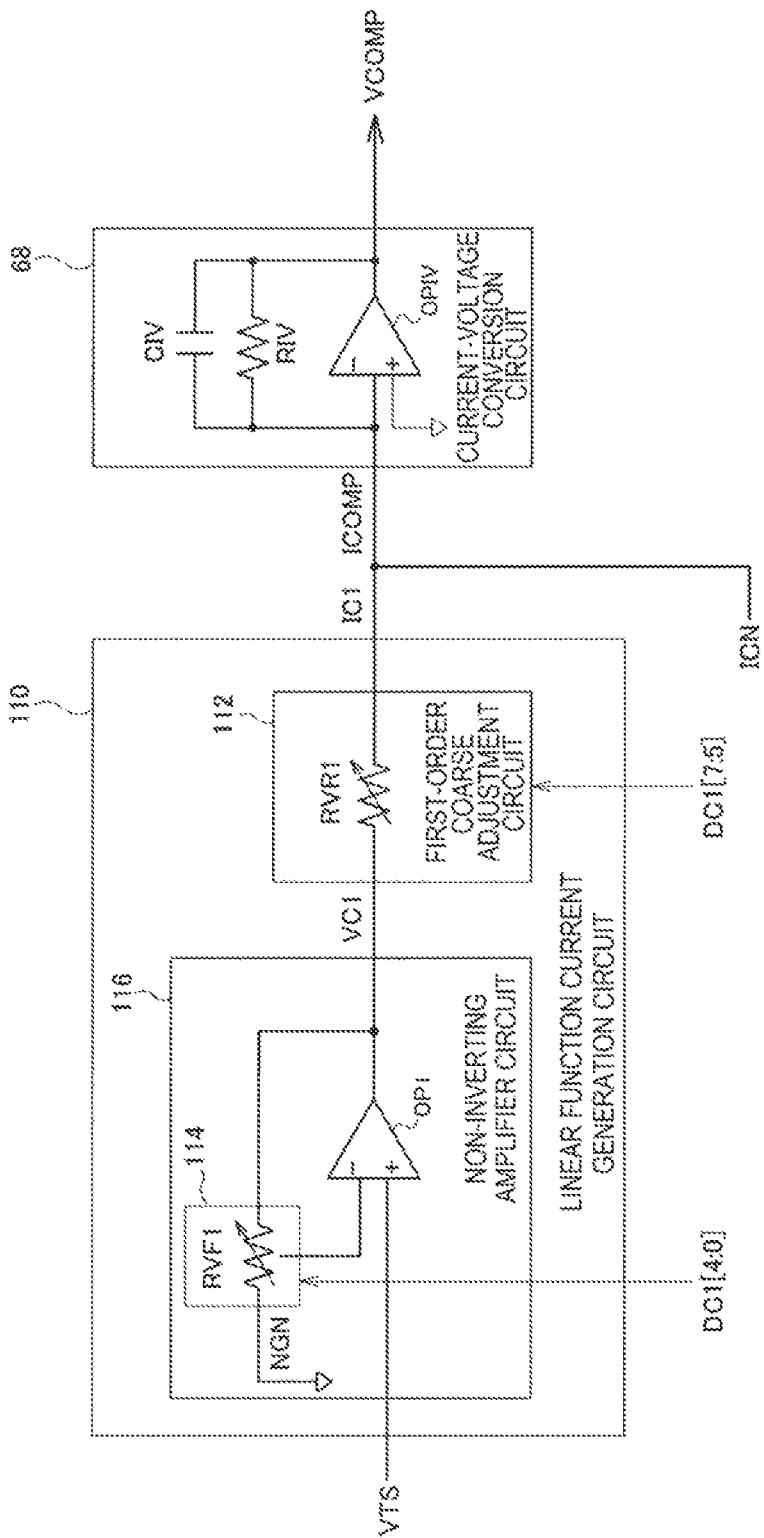
FIG. 9 is a diagram showing a detailed configuration example of a linear function current generation circuit and a current-voltage conversion circuit.

4. Linear Function Current Generation Circuit, Current-Voltage Conversion Circuit FIG. 9 shows a detailed configuration example of the linear function current generation circuit 110 and a current-voltage conversion circuit 68.

The linear function current generation circuit 110 includes a non-inverting amplifier circuit 116 and the first-order coarse adjustment circuit 112.

The non-inverting amplifier circuit 116 includes an operational amplifier OP1 and the first-order fine adjustment circuit 114. The non-inverting amplifier circuit 116 amplifies the temperature detection voltage VTS to thereby output a linear function voltage VC1.

The first-order fine adjustment circuit 114 is a first variable resistive circuit RVF1 to be coupled to an output node of the operational amplifier OP1, an inverting input node of the operational amplifier OP1, and the ground node NGN. The first variable resistive circuit RVF1 adjusts the ratio between a first resistance value and a second resistance value based on first-order lower bits DC1[4:0]. The first resistance value is a resistance value between the output node and the inverting input node of the operational amplifier OP1. The second resistance value is a resistance value between the inverting input node of the operational amplifier OP1 and the ground node NGN. To the non-inverting input node of the operational amplifier OP1, there is input the temperature detection voltage VTS.

For example, the first variable resistive circuit RVF1 includes a plurality of resistors and a plurality of switches. The plurality of resistors is coupled in series between the output node of the operational amplifier OP1 and the ground node NGN. A switch is coupled between one end of each of the resistors and the inverting input node of the operational amplifier OP1. These switches correspond to the plurality of switches described above. Corresponding one of the switches to the value of the first-order lower bits DC1[4:0] is set to the on state. Thus, the ratio between the first resistance value and the second resistance value is adjusted.

The gain of the non-inverting amplifier circuit 116 is expressed as 1+((first resistance value)/(second resistance value)). By adjusting the ratio between the first resistance value and the second resistance value based on the first-order lower bits DC1[4:0], the gain of the non-inverting amplifier circuit 116 is adjusted. As shown in FIG. 8, the temperature detection voltage VTS is a linear function with respect to the temperature. Since the linear function voltage VC1 is a voltage obtained by multiplying the temperature detection voltage VTS by the gain, by adjusting the gain based on the first-order lower bits DC1[4:0], the gradient of the linear function voltage VC1 is adjusted. The linear function voltage VC1 is converted by the first-order coarse adjustment circuit 112 into a linear function current IC1. In other words, the adjustment of the linear function voltage VC1 corresponds to the fine adjustment of the linear function current IC1.

The first-order coarse adjustment circuit 112 is a second variable resistive circuit RVR1 to be coupled between an output node of the non-inverting amplifier circuit 116 and an input node of the current-voltage conversion circuit 68. The second variable resistive circuit RVR1 adjusts the resistance value between the output node of the non-inverting amplifier circuit 116 and the input node of the current-voltage conversion circuit 68 based on the first-order higher bits DC[7:5].

The second variable resistive circuit RVR1 includes a plurality of resistors coupled in series to each other and a plurality of switches. A switch is coupled in parallel to each of the resistors. These switches correspond to the plurality of switches described above. By each of the switches being set to the on state or the off state in accordance with the first-order higher bits DC1[7:5], the resistance value of the second variable resistive circuit RVR1 is set.

The current-voltage conversion circuit 68 includes an operational amplifier OPIV, a resistor RIV, and a capacitor CIV. The non-inverting input node of the operational amplifier OPIV is coupled to the ground node NGN. The resistor RIV and the capacitor CIV are coupled in parallel to each other between an output node and an inverting input node of the operational amplifier OPIV.

The input node of the current-voltage conversion circuit 68 is kept at a constant voltage due to the virtual short of the operational amplifier OPIV. Therefore, by adjusting the resistance value of the second variable resistive circuit RVR1 based on the first-order higher bits DC1[7:5], the coarse adjustment of the linear function current IC1 is achieved.

Further, the second variable resistive circuit RVR1 and the current-voltage conversion circuit 68 constitute an inverting amplifier circuit having the linear function voltage VC1 as input. The gain of this inverting amplifier circuit is expressed as −(resistance value of the resistor RIV)/(resistance value of the second variable resistive circuit RVR1). By setting the resistance value of the second variable resistive circuit RVR1 based on the first-order higher bits DC1[7:5], the gain of the inverting amplifier circuit is adjusted, and due to the gain adjustment, the coarse adjustment for the first-order constituent of the temperature compensation voltage VCOMP is achieved.

Assuming that the entire adjustment with the first-order correction data DC1[7:0] is performed using substantially the same configuration as the first-order coarse adjustment circuit 112 without providing the first-order fine adjustment circuit 114, the 256 steps of variable resistive circuits are necessary. Since the variable resistive circuits are disposed in the channel through which the first-order function current IC1 flows, a transistor large in gate area is necessary for switching the variable resistive circuit in order to reduce the 1/f noise. Therefore, the large layout area becomes necessary when the number of the steps of the resistance value is large. In the present embodiment, since the coarse adjustment and the fine adjustment are separated from each other, it is possible to dramatically reduce the number of the steps of the variable resistive circuits, and thus, it is possible to reduce the layout area. Further, the first-order fine adjustment circuit 114 is coupled to the inverting input node of the operational amplifier OP1 through which no current flows. Thus, since a transistor small in gate area can be used for the first-order fine adjustment circuit 114, it is possible to achieve the high-resolution adjustment while suppressing the layout area.

5. Temperature Sensor

Figure 10:
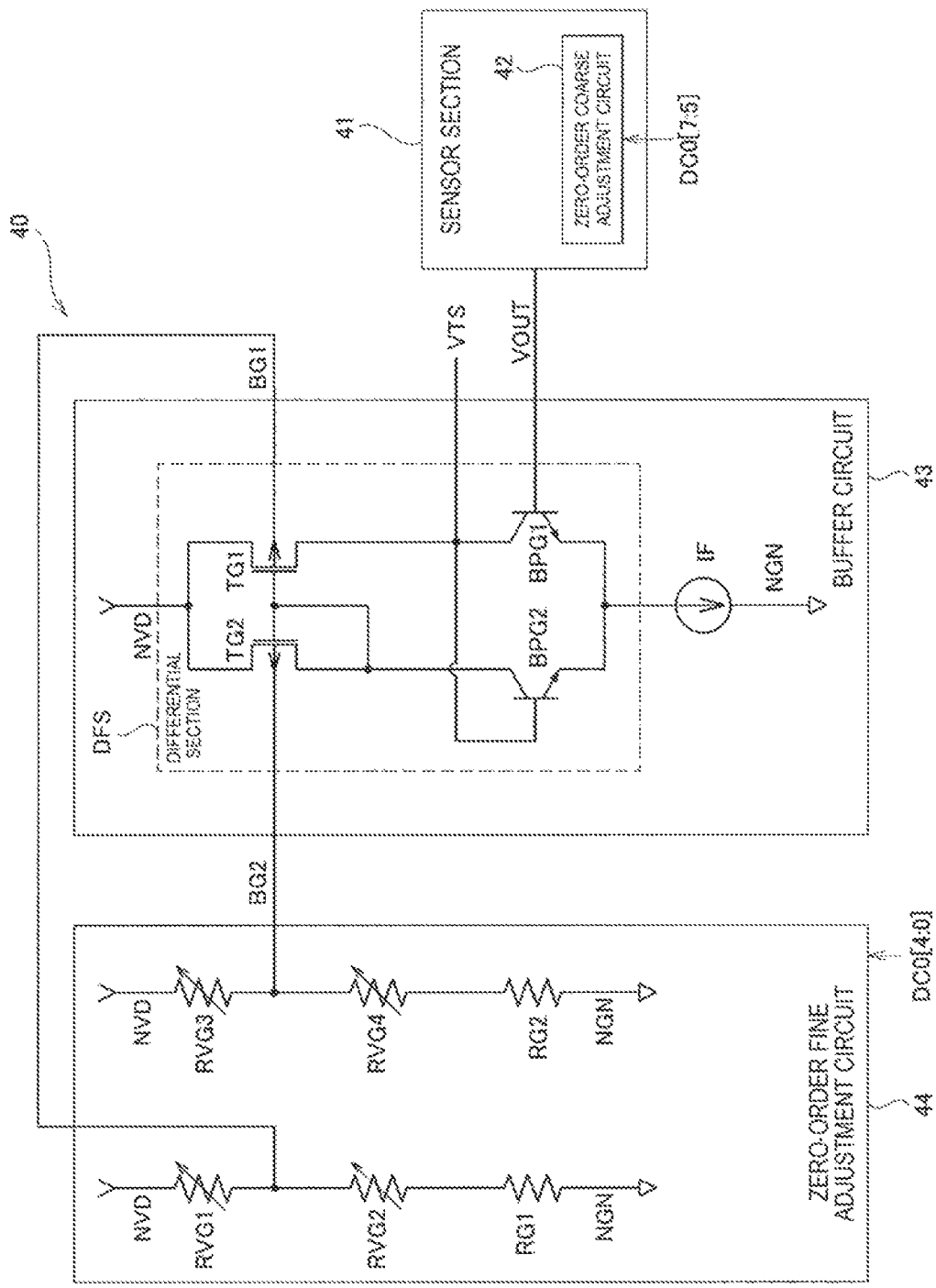
FIG. 10 is a diagram showing a detailed configuration example of a temperature sensor.
Figure 11:
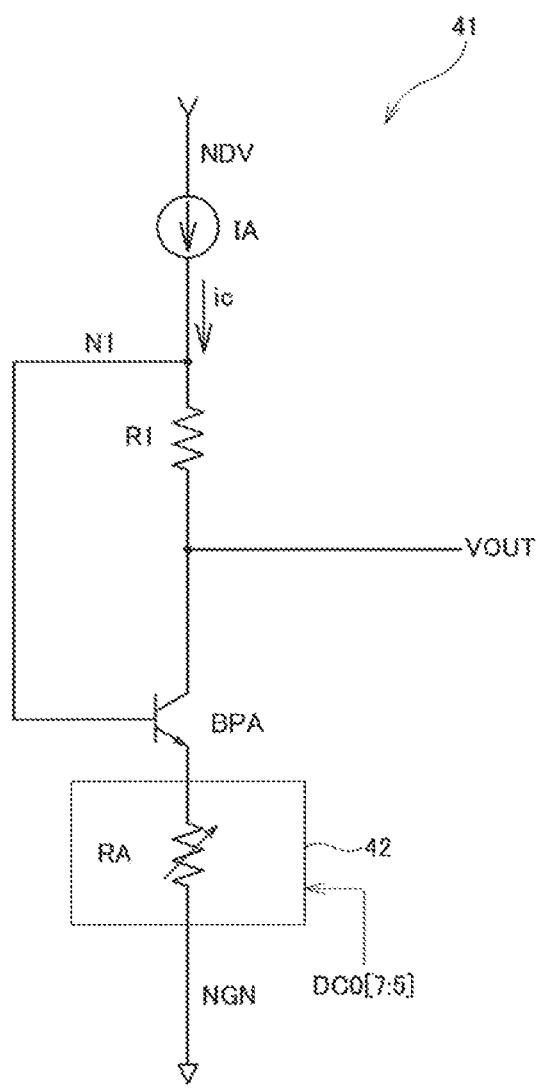
FIG. 11 is a diagram showing a detailed configuration example of a sensor section.

FIG. 10 shows a detailed configuration example of the temperature sensor 40. The temperature sensor 40 includes a sensor section 41, a buffer circuit 43, and a zero-order fine adjustment circuit 44. FIG. 11 shows a detailed configuration example of the sensor section 41. The sensor section 41 includes a constant current circuit IA, a resistor R1, a bipolar transistor BPA, and a zero-order coarse adjustment circuit 42.

Firstly, the sensor section 41 shown in FIG. 11 will be described. The constant current circuit IA is disposed between a power supply node NVD and a first node N1, and outputs a constant current ic to the first node N1. For example, the constant current circuit IA is constituted by a resistor disposed between the power supply node NVD and the ground node NGN, and a current mirror circuit for mirroring the current flowing through the resistor to thereby output the constant current ic.

The first node N1 is coupled to a base node of the bipolar transistor BPA. The resistor R1 is disposed between the first node N1 and a collector node of the bipolar transistor BPA. In other words, one end of the resistor R1 is coupled to the first node N1, and the other end of the resistor R1 is coupled to the collector node of the bipolar transistor BPA.

The zero-order coarse adjustment circuit 42 is a variable resistive circuit RA disposed between an emitter node of the bipolar transistor BPA and the ground node NGN. One end of the variable resistive circuit RA is coupled to the emitter node of the bipolar transistor BPA, and the other end of the variable resistive circuit RA is coupled to the ground node NGN. The resistance value of the variable resistive circuit RA is set by the zero-order higher bits DC0[7:5].

The variable resistive circuit RA includes a plurality of resistors coupled in series to each other and a plurality of switches. A switch is coupled in parallel to each of the resistors. These switches correspond to the plurality of switches described above. By each of the switches being set to the on state or the off state in accordance with the zero-order higher bits DC0[7:5], the resistance value of the variable resistive circuit RA is set.

The output voltage VOUT is expressed as the following formula (1). The reference symbol VbeA denotes a base-emitter voltage of the bipolar transistor BPA. The base-emitter voltage VbeA is a linear function with respect to the temperature, and has a negative gradient.

$$VOUT = VbeA + ic \times (RA - R1) \quad (1)$$

As shown in the formula (1) described above, the output voltage includes $ic \times (RA-R1)$ as an offset component. In other words, by changing the resistance value of the variable resistive circuit RA, it is possible to adjust the offset of the output voltage VOUT. As shown in FIG. 10, the buffer circuit 43 buffers the output voltage VOUT to output the temperature detection voltage VTS. In other words, by adjusting the offset of the output voltage VOUT based on the zero-order higher bits DC0[7:5], the coarse adjustment of the offset of the temperature detection voltage VTS is achieved.

Then, the buffer circuit 43 and the zero-order fine adjustment circuit 44 shown in FIG. 10 will be described.

The buffer circuit 43 buffers the output voltage VOUT from the sensor section 41 to output the temperature detection voltage VTS. The buffer circuit 43 is, for example, an amplifier circuit having the gain of 1. The buffer circuit 43 has a differential section, and the differential section has a current mirror circuit, and differential pair transistors electrically coupled to the current mirror circuit.

The zero-order fine adjustment circuit 44 outputs back gate voltages BG1, BG2 to the back gates of the transistors constituting the current mirror circuit to thereby control the offset of the output voltage of the differential section. Thus, the offset of the temperature detection voltage VTS output by the buffer circuit 43 is adjusted. The offset adjustment by the variable resistive circuit of the sensor section 41 corresponds to the coarse adjustment, and the offset adjustment by the control of the back gate voltage corresponds to the fine adjustment. In other words, one step in the offset adjustment by the control of the back gate voltage is smaller than one step in the offset adjustment by the variable resistive circuit of the sensor section 41.

FIG. 10 shows a detailed configuration example of the buffer circuit 43 and the zero-order fine adjustment circuit 44.

The buffer circuit 43 includes the differential section DFS and the constant current circuit IF. The differential section DFS includes a P-type transistor TG1 as a first zero-order transistor, a P-type transistor TG2 as a second zero-order transistor, a bipolar transistor BPG1 as a first differential pair transistor, and a bipolar transistor BPG2 as a second differential pair transistor.

The P-type transistors TG1, TG2 constitute a current mirror circuit. In other words, the source of each of the P-type transistors TG1, TG2 is coupled to the power supply node NVD, the gate of the P-type transistor TG2 is coupled to the gate of the P-type transistor TG1 and the drain of the P-type transistor TG2.

The differential pair constituted by the bipolar transistors BPG1, BPG2 is coupled to the current mirror circuit. In other words, the collector nodes of the bipolar transistors BPG1, BPG2 are respectively coupled to the drain of the P-type transistor TG1 and the drain of the P-type transistor TG2. The emitter node of each of the bipolar transistors BPG1, BPG2 is coupled to one end of the constant current circuit IF. The other end of the constant current circuit IF is coupled to the ground node NGN.

The buffer circuit 43 is a voltage follower circuit. Specifically, the output voltage VOUT from the sensor section 41 is input to the base node of the bipolar transistor BPG1. The collector node of the bipolar transistor BPG1 corresponds to an output node of the buffer circuit 43, and the output node is coupled to the base node of the bipolar transistor BPG2. The buffer circuit 43 outputs the collector voltage of the bipolar transistor BPG1 as the temperature detection voltage VTS.

The zero-order fine adjustment circuit 44 controls the back gate voltage BG1 of the P-type transistor TG1 and the back gate voltage BG2 of the P-type transistor TG2 based on the zero-order lower bits DC0[4:0]. The zero-order fine adjustment circuit 44 is a voltage generation circuit for generating the back gate voltages BG1, BG2. The zero-order fine adjustment circuit 44 includes resistors RG1, RG2, and variable resistive circuits RVG1 through RVG4.

The variable resistive circuits RVG1, RVG2 and the resistor RG1 are coupled in series to each other between the power supply node NVD and the ground node NGN. The variable resistive circuits RVG1, RVG2 and the resistor RG1 constitute a voltage divider circuit for dividing the power supply voltage, and the divisional voltage is output from a node located between the variable resistive circuits RVG1 and RVG2. The divisional voltage is input to the back gate of the P-type transistor TG1 as the back gate voltage BG1. The variable resistive circuits RVG3, RVG4 and the resistor RG2 constitute a voltage divider circuit for dividing the power supply voltage, and the divisional voltage is output from a node located between the variable resistive circuits RVG3 and RVG4. The divisional voltage is input to the back gate of the P-type transistor TG2 as the back gate voltage BG2.

The resistance values of the variable resistive circuits RVG1 through RVG4 are set based on the zero-order lower bits DC0[4:0]. For example, the back gate voltages BG1 and BG2 change in respective directions opposite to each other. In other words, the resistance values of the variable resistive circuits RVG1 through RVG4 are set so that the back gate voltage BG2 drops when raising the back gate voltage BG1, the back gate voltage BG2 rises when decreasing the back gate voltage BG1. Alternatively, it is possible for the voltages BG1, BG2 to be set independently of each other.

When the back gate voltages BG1, BG2 change, the threshold voltages of the P-type transistors TG1, TG2 change, and therefore, the drain current of the P-type transistor TG1 and the drain current of the P-type transistor TG2 change. Thus, the balance in current supplied to the bipolar transistors BPG1, BPG2 constituting the differential pair changes, and therefore, the offset of the output voltage of the differential section DFS changes. In other words, the offset of the temperature detection voltage VTS changes. In such a manner, by the zero-order fine adjustment circuit 44 controlling the back gate voltages BG1, BG2 based on the zero-order lower bits DC0[4:0], it is possible to perform the fine adjustment of the offset of the temperature detection voltage VTS.

Assuming that the entire adjustment with the zero-order correction data DC0[7:0] is performed using substantially the same configuration as the zero-order coarse adjustment circuit 42 without providing the zero-order fine adjustment circuit 44, the 256 steps of variable resistive circuits are necessary. Since the current flowing through the bipolar transistor BPA generating the output voltage OUT flows through the variable resistive circuits, a transistor large in gate area is necessary for switching the variable resistive circuit in order to reduce the 1/f noise. Therefore, the large layout area becomes necessary when the number of the steps of the resistance value is large. In the present embodiment, since the coarse adjustment and the fine adjustment are separated from each other, it is possible to dramatically reduce the number of the steps of the variable resistive circuits, and thus, it is possible to reduce the layout area. Further, the zero-order fine adjustment circuit 44 supplies the back gate voltage to the back gate through which no current flows. Thus, since a circuit element small in area can be used for the zero-order fine adjustment circuit 44, it is possible to achieve the high-resolution adjustment while suppressing the layout area.

6. Oscillator

Hereinafter, there is described when the method of adjusting the temperature compensation voltage VCOMP according to the present disclosure is applied to an oscillator, but the application target of the adjustment method according to the present disclosure is not limited thereto. In other words, the adjustment method according to the present disclosure can be applied to a circuit device including a circuit for outputting the temperature compensation voltage based on the temperature detection voltage from the temperature sensor, and a circuit which operates based on the temperature compensation voltage.

Figure 12:
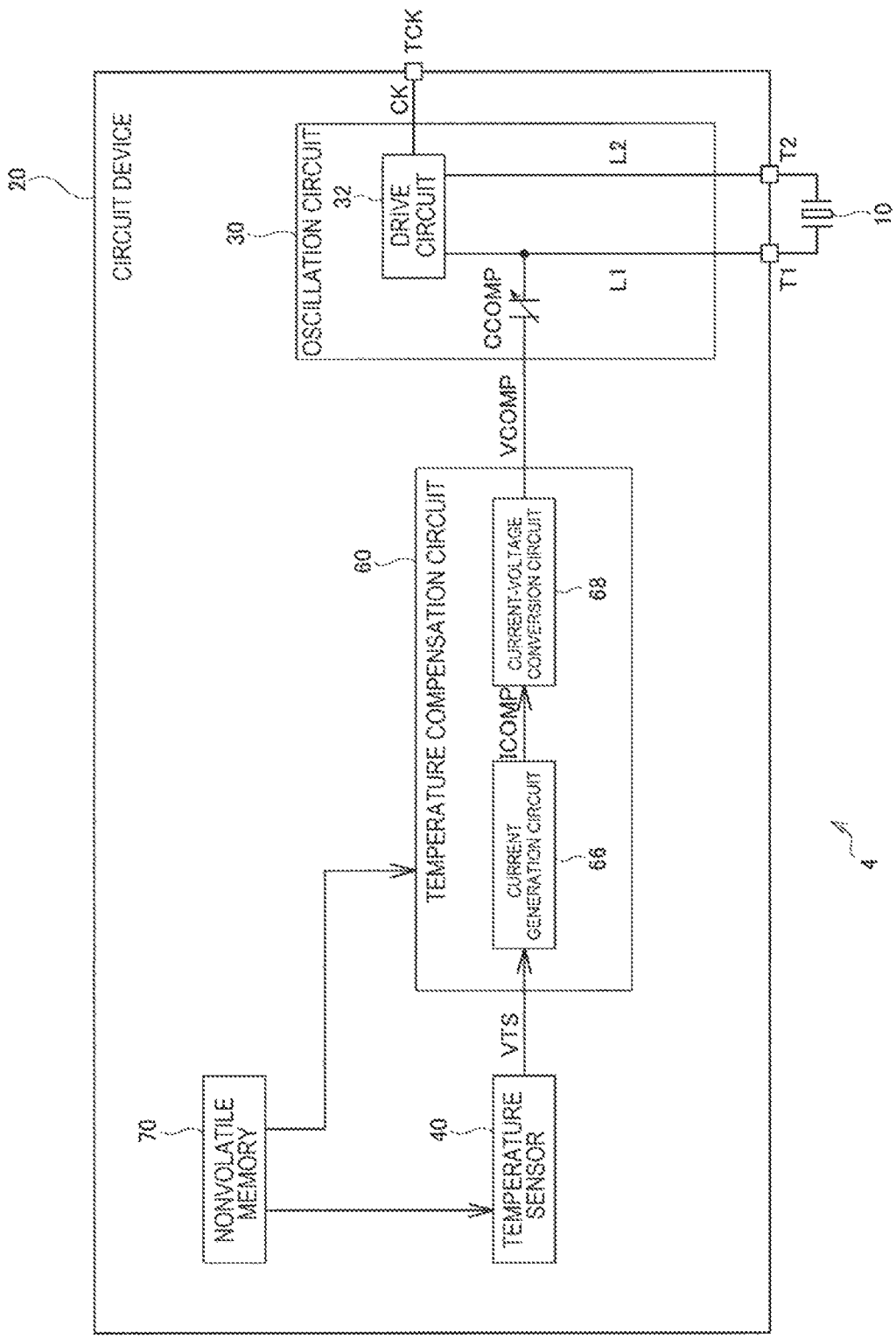
FIG. 12 is a diagram showing a configuration example of an oscillator and a second configuration example of the circuit device.

FIG. 12 is a diagram showing a configuration example of an oscillator 4 and a second configuration example of the circuit device 20. The oscillator 4 includes the resonator 10 and the circuit device 20.

The resonator 10 is an element for generating a mechanical vibration due to an electrical signal. The vibrator 10 can be realized by a resonator element such as a quartz crystal resonator element. The resonator 10 can be realized by, for example, a quartz crystal resonator element vibrating in a thickness-shear mode having the cutting angle of AT-cut or SC-cut. For example, the resonator 10 can be a resonator as an SPXO (Simple Packaged Crystal Oscillator). Alternatively, the resonator 10 can be a resonator incorporated in an oven-controlled oscillator (OCXO) equipped with a constant-temperature oven, or can also be a resonator incorporated in a temperature-compensated crystal oscillator (TCXO) not provided with the constant-temperature oven. It should be noted that the resonator 10 according to the present embodiment can be realized by a variety of resonator elements such as a resonator element other than the thickness-shear vibration type or a piezoelectric resonator element formed of a material other than the quartz crystal. For example, as the resonator 10, it is also possible to adopt a surface acoustic wave (SAW) resonator, an MEMS (micro electro-mechanical systems) resonator as a silicon resonator formed using a silicon substrate, and so on.

The circuit device 20 is an integrated circuit device called an IC (Integrated Circuit). For example, the circuit device 20 is an IC manufactured using a semiconductor process, and a semiconductor chip having circuit elements formed on a semiconductor substrate. The circuit device 20 includes an oscillation circuit 30, the temperature sensor 40, a temperature compensation circuit 60, a nonvolatile memory 70, and terminals T1, T2, and TCK.

The terminals T1, T2, and TCK are, for example, pads of the circuit device 20. The terminal T1 is electrically coupled to one end of the resonator 10, and the terminal T2 is electrically coupled to the other end of the resonator 10. The resonator 10 and each of the terminals T1, T2 are electrically coupled to each other using, for example, the internal interconnection of the package for housing the resonator 10 and the circuit device 20, the bonding wire, or the metal bump. The terminal TCK is a terminal from which a clock signal CK generated by the circuit device 20 is output. The terminal TCK is electrically coupled to an external terminal for external coupling of the oscillator 4. The terminal TCK and the external terminal are electrically coupled to each other using, for example, the internal interconnection of the package, the bonding wire, or the metal bump. Further, the external terminal of the oscillator 4 is electrically coupled to an external device.

The temperature sensor 40 is a sensor for detecting the temperature. Specifically, the temperature sensor 40 uses the temperature dependency provided to the forward voltage of a PN junction to thereby output the temperature detection voltage VTS having a voltage value changing dependently on the temperature. Further, the temperature sensor 40 performs offset correction of the temperature detection voltage VTS based on zero-order correction data stored in the nonvolatile memory 70. In other words, the temperature sensor 40 adjusts the offset of the temperature detection voltage VTS as much as the offset represented by the zero-order correction data. It should be noted that the offset correction of the temperature detection voltage VTS corresponds to zero-order correction in the temperature compensation of the oscillation frequency.

The temperature compensation circuit 60 outputs the temperature compensation voltage VCOMP based on the temperature detection voltage VTS to thereby perform the temperature compensation of the oscillation frequency of the oscillation circuit 30. The temperature compensation voltage VCOMP is a voltage for canceling or reducing the temperature characteristic of the oscillation frequency. The temperature compensation circuit 60 includes a current generation circuit 66 and a current-voltage conversion circuit 68. The current generation circuit 66 outputs the temperature compensation current ICOMP with polynomial approximation using the temperature as a parameter. When the temperature compensation voltage VCOMP is approximated with, for example, a fifth-degree polynomial, a zero-order coefficient, a first-order coefficient, a second-order coefficient, a third-order coefficient, a fourth-order coefficient, and a fifth-order coefficient are stored in the nonvolatile memory 70 as a zero-order correction datum, a first-order correction datum, a second-order correction datum, a third-order correction datum, a fourth-order correction datum, and a fifth-order correction datum, respectively. The current generation circuit 66 performs the temperature compensation based on the first-order correction datum, the second-order correction datum, the third-order correction datum, the fourth-order correction datum, and the fifth-order correction datum. It should be noted that the zero-order correction is performed by the temperature sensor 40 as described above. The polynomial approximation is not limited to the fifth-degree polynomial approximation. The current-voltage conversion circuit 68 converts the temperature compensation current ICOMP output by the current generation circuit 66 into the temperature compensation voltage VCOMP.

The nonvolatile memory 70 stores the temperature compensation data used for the temperature compensation of the oscillation frequency. The temperature compensation data comprise the zero-order correction datum, the first-order correction datum, the second-order correction datum, the third-order correction datum, the fourth-order correction datum, and the fifth-order correction datum. For example, when manufacturing the oscillator 4, a test instrument measures the temperature characteristic of the oscillation frequency based on the clock signal CK output by the oscillator 4. The test instrument performs the polynomial approximation of the temperature characteristic thus measured to obtain the coefficients of the respective terms, and then writes the coefficients into the nonvolatile memory 70 as the temperature compensation data.

The nonvolatile memory 70 is, for example, an EEPROM (Electrically Erasable Programmable Read Only Memory) or a flash memory. The EEPROM can be realized by, for example, floating-gate memory cells. The flash memory can be realized by, for example, MONOS (Metal Oxide Nitride Oxide Silicon) memory cells. Alternatively, the nonvolatile memory 70 can also be a memory using fuse cells. In the memory of this type, the fuse cell as the memory cell includes a resistor and a selector element coupled in series to the resistor. The selector element is, for example, a PN-junction diode or a MOS transistor. For example, one end of the resistor is coupled to a bit line, and the other end of the resistor is coupled to the anode of the diode. The cathode of the diode is coupled to a word line. The resistor functioning as the fuse element is a programmable resistor having a variable resistance value. Due to the variable resistance value, a datum is stored in the fuse cell.

The oscillation circuit 30 is a circuit for oscillating the resonator 10. The oscillation circuit 30 is electrically coupled to the terminal T1 and the terminal T2, and oscillates the resonator 10. As the oscillation circuit 30, there can be used a variety of types of oscillation circuit such as a Pierce type, a Colpitts type, an inverter type, and a Hartley type. The oscillation circuit 30 cancels or reduces the temperature characteristic of the oscillation frequency based on the temperature compensation voltage VCOMP. Specifically, the oscillation circuit 30 includes a drive circuit 32 and a variable capacitance capacitor CCOMP.

The drive circuit 32 is coupled to the terminal T1 via a node L1, and is coupled to the terminal T2 via a node L2. The drive circuit 32 drives the resonator 10 coupled to the terminals T1, T2 to thereby oscillate the resonator 10. The drive circuit 32 can be realized by a transistor such as a bipolar transistor, and a passive element such as a capacitor or a resistor.

One end of the variable capacitance capacitor CCOMP is coupled to the node L1. Alternatively, one end of the variable capacitance capacitor CCOMP can be coupled to the node L2. The other end of the variable capacitance capacitor CCOMP is coupled to an output node of the temperature compensation circuit 60. The variable capacitance capacitor CCOMP is, for example, a MOS capacitor. One end of the MOS capacitor is the gate of a MOS transistor, and the other end of the MOS capacitor is the source and the drain of the MOS transistor.

The clock signal CK is output based on the oscillation signal. For example, the oscillation circuit 30 includes a buffer circuit, it is also possible for the buffer circuit to buffer the oscillation signal to output the clock signal. Alternatively, it is possible for the circuit device 20 to include an output circuit not shown. The output circuit can include a frequency divider circuit for dividing the frequency of the oscillation signal, and a buffer circuit for buffering the output clock signal of the frequency divider circuit to output the clock signal CK.

Figure 13:
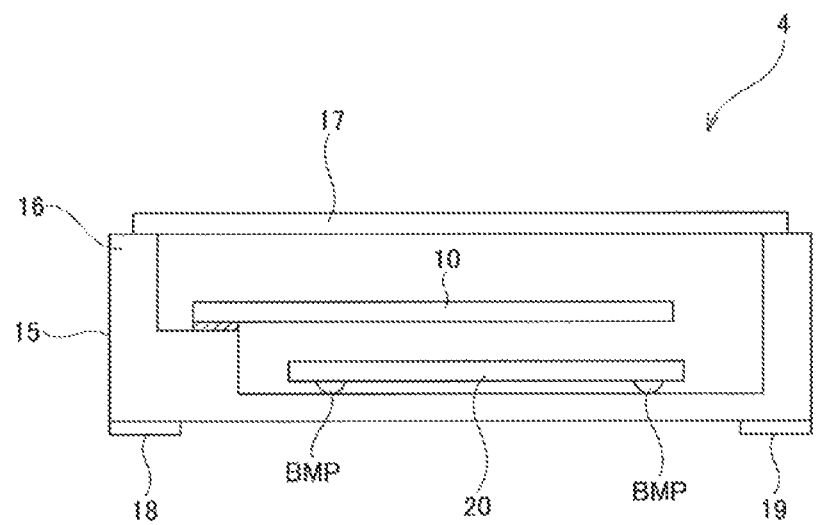
FIG. 13 is a diagram showing a first structural example of the oscillator.

Then, a structural example of the oscillator 4 according to the present embodiment will be described. FIG. 13 shows a first structural example of the oscillator 4. The oscillator 4 has the resonator 10, the circuit device 20, and a package 15 for housing the resonator 10 and the circuit device 20. The package 15 is formed of, for example, ceramics, and has a housing space inside, and houses the resonator 10 and the circuit device 20 in the housing space. The housing space is airtightly sealed, and is set to a reduced-pressure state, desirably a state approximate to a vacuum state. Due to the package 15, it is possible to protect the resonator 10 and the circuit device 20 from an impact, dust, heat, moisture, and so on in good condition.

The package 15 has a base 16 and a lid 17. Specifically, the package 15 is constituted by the base 16 for supporting the resonator 10 and the circuit device 20, and the lid 17 bonded to the upper surface of the base 16 so that the housing space is formed between the base 16 and the lid 17. Further, the resonator 10 is supported by a step part disposed inside the base 16 via terminal electrodes. Further, the circuit device 20 is disposed on the inner bottom surface of the base 16. Specifically, the circuit device 20 is disposed so that an active surface faces to the inner bottom surface of the base 16. The active surface is a surface on which the circuit elements of the circuit device 20 are formed. Further, the bumps BMP are formed on the terminals as the pads of the circuit device 20. Further, the circuit device 20 is supported by the inner bottom surface of the base 16 via the electrically conductive bumps BMP. The electrically conductive bumps BMP are, for example, metal bumps, and the resonator 10 and the circuit device 20 are electrically coupled to each other via the bumps BMP, internal interconnections and the terminal electrodes of the package 15, and so on. Further, the circuit device 20 is electrically coupled to external terminals 18, 19 of the oscillator 4 via the bumps BMP and the internal interconnections of the package 15. The external terminals 18, 19 are formed on the outer bottom surface of the package 15. The external terminals 18, 19 are coupled to an external device via external interconnections. The external interconnections are, for example, interconnections formed on the circuit board on which the external device is mounted. Thus, it becomes possible to output the clock signal and so on to the external device.

It should be noted that although in FIG. 13, the circuit device 20 is flip-mounted so that the active surface of the circuit device 20 faces downward, the present embodiment is not limited to such a mounting arrangement. For example, it is possible to mount the circuit device 20 so that the active surface of the circuit device 20 faces upward. In other words, the circuit device 20 is mounted so that the active surface is opposed to the resonator 10.

Figure 14:
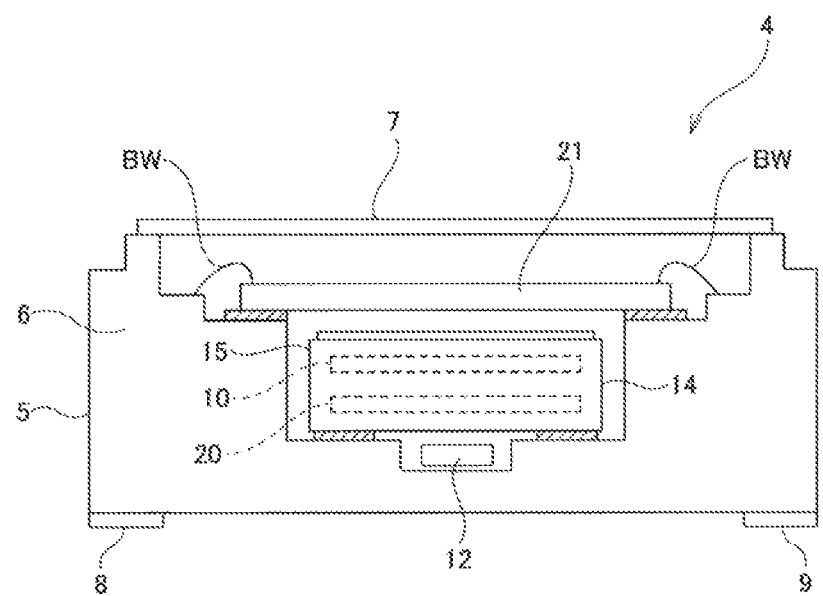
FIG. 14 is a diagram showing a second structural example of the oscillator.

FIG. 14 shows a second structural example of the oscillator 4. The oscillator 4 shown in FIG. 14 includes the resonator 10, the circuit device 20, and a circuit device 21. Further, the oscillator 4 includes the package 15 for housing the resonator 10 and the circuit device 20, and a package 5 for housing the package 15 and the circuit device 21. The package 15 and the package 5 are a first package and a second package, respectively. The first package and the second package can also be called a first container and a second container, respectively.

Further, in the present embodiment, the circuit device 20 housed in the package 15 performs a first temperature compensation process, and the circuit device 21 housed in the package 5 performs a second temperature compensation process. For example, by housing the resonator 10 and the circuit device 20 in the package 15, there is constituted the oscillator 14 of the temperature compensation type for performing, for example, an analog type first temperature compensation process. Further, by housing the oscillator 14 performing the analog type first temperature compensation process and the circuit device 21 performing a digital type second temperature compensation process in the package 5, there is constituted the oscillator 4 for generating the clock signal high in accuracy. The circuit device 21 can be called a correction IC for performing the second temperature compensation process as the fine adjustment in a digital manner. The adjustment method according to the present disclosure can be applied to the analog type first temperature compensation process in the circuit device 20.

Specifically, the package 5 is formed of, for example, ceramics, and has a housing space inside. In the housing space, there are housed the oscillator 14 having the resonator 10 and the circuit device 20 housed in the package 15, and the circuit device 21. The housing space is airtightly sealed, and is set to a reduced-pressure state, desirably a state approximate to a vacuum state. Due to the package 5, it is possible to protect the circuit device and the oscillator 14 from an impact, dust, heat, moisture, and so on in good condition.

The package 5 has a base 6 and a lid 7. Specifically, the package 5 is constituted by the base 6 for supporting the oscillator 14 and the circuit device 21, and the lid 7 bonded to the upper surface of the base 6 so that the housing space is formed between the base 6 and the lid 7. The base 6 has a first recessed part opening in the upper surface and a second recessed part opening in the bottom surface of the first recessed part in the inside thereof. The circuit device 21 is supported by the bottom surface of the first recessed part. For example, the circuit device 21 is supported by a step part of the bottom surface via terminal electrodes. Further, the oscillator 14 is supported by the bottom surface of the second recessed part. For example, the oscillator 14 is supported by the step part of the bottom surface via terminal electrodes. Further, the base 6 has a third recessed part opening on the bottom surface of the second recessed part, and a circuit component 12 is disposed in the third recessed part. As the circuit component 12 to be disposed, there can be assumed, for example, a capacitor or a temperature sensor.

The circuit device 21 is electrically coupled to terminals of the oscillator 14 via, for example, the bonding wires BW, the terminal electrodes formed on the step part, or the internal interconnections of the package 5. Thus, it becomes possible to input the clock signal and the temperature detection signal from the oscillator 14 to the circuit device 21. Further, the circuit device 21 is electrically coupled to external terminals 8, 9 of the oscillator 4 via the bonding wires BW, the terminal electrodes formed on the step part, or the internal interconnections of the package 5. The external terminals 8, 9 are formed on the outer bottom surface of the package 5. The external terminals 8, 9 are coupled to an external device via external interconnections. The external interconnections are, for example, interconnections formed on the circuit board on which the external device is mounted. Thus, it becomes possible to output the clock signal and so on to the external device. It should be noted that it is possible to electrically couple the terminals of the oscillator 14 and the external terminals 8, 9 to each other.

It should be noted that although in FIG. 14, the circuit device 21 is disposed on the upper side of the oscillator 14, it is also possible to arrange that the circuit device 21 is disposed on the lower side of the oscillator 14. Here, the upper side means a direction from the bottom surface of the package toward the lid 7, and the lower side means the opposite direction. Further, it is also possible to dispose the circuit device 21 laterally to the oscillator 14. In other words, the oscillator 14 and the circuit device 21 are arranged side by side in the top view of the oscillator 4.

Then, the circuit device 21 will be described. The circuit device 21 includes a clock signal generation circuit to which a first clock signal as the clock signal generated in the oscillator 14 is input as a reference clock signal. Further, a clock signal generated by the clock signal generation circuit is output to the outside as the output clock signal of the oscillator 4. For example, the clock signal generation circuit of the circuit device 21 is constituted by a fractional-N PLL circuit to which the first clock signal from the oscillator 14 is input as the reference clock signal. The PLL circuit performs phase comparison between the reference clock signal as a first clock signal, and a feedback clock signal obtained by frequency-dividing the output clock signal of the PLL circuit with a frequency divider circuit. Further, by setting the fractional frequency division ratio using a delta-sigma modulation circuit, the fractional-N PLL circuit is realized. Further, by the control circuit included in the circuit device 21 performing the correction process of the frequency division ratio data set to the PLL circuit based on the temperature compensation data, the second temperature compensation process is realized. Further, it is possible for the clock signal generation circuit to be constituted by a direct digital synthesizer. In this case, by inputting frequency control data corrected by the temperature compensation data to the direct digital synthesizer which operates using the first clock signal as the reference clock signal, the second temperature compensation process is realized.

7. Electronic Apparatus, Vehicle

Figure 15:
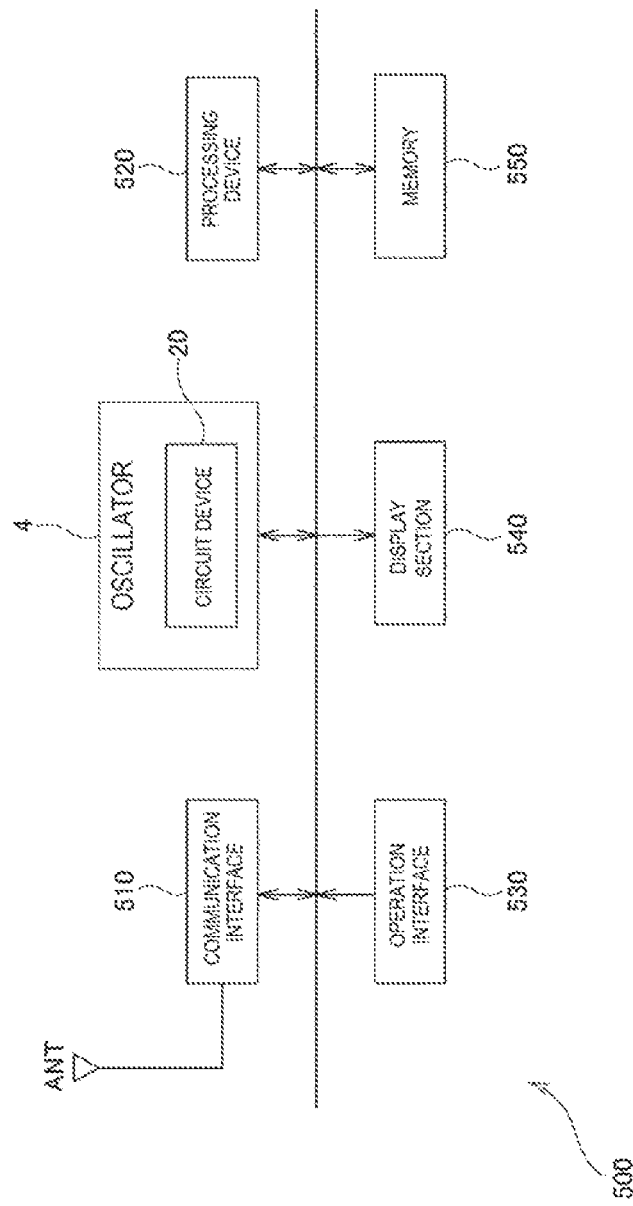
FIG. 15 is a diagram showing a configuration example of an electronic apparatus.

FIG. 15 shows a configuration example of the electronic apparatus 500 including the circuit device 20 according to the present embodiment. The electronic apparatus 500 includes the circuit device 20 according to the present embodiment and a processing device 520 which operates using the clock signal based on the oscillation signal of the oscillation circuit 30 of the circuit device 20. Specifically, the electronic apparatus 500 includes the oscillator 4 having the circuit device 20 according to the present embodiment, and the processing device 520 operates based on the clock signal from the oscillator 4. Further, the electronic apparatus 500 can include an antenna ANT, a communication interface 510, an operation interface 530, a display section 540, and a memory 550. It should be noted that the configuration of the electronic apparatus 500 is not limited to the configuration shown in FIG. 15, but it is possible to adopt a variety of modified implementations such as elimination of some of the constituents or addition of other constituents.

The electronic apparatus 500 is, for example, a network-related apparatus such as a base station or a router, a highly accurate measurement instrument for measuring a physical quantity such as a distance, time, flow speed, or a flow rate, a biological information measurement apparatus for measuring biological information, or an in-car apparatus. The biological information measurement apparatus is, for example, an ultrasonic measurement device, a sphygmograph, or a blood-pressure measurement device. The in-car apparatus is an apparatus for automated driving, or the like. Further, the electronic apparatus 500 can also be a wearable apparatus such as a head-mounted display device or a timepiece related apparatus, a robot, a printer, a projection apparatus, a portable information terminal such as a smartphone, a content supply apparatus for delivering contents, or a video apparatus such as a digital camera or a video camera.

Further, as the electronic apparatus 500, there can be cited an apparatus to be used in a next-generation mobile communication system such as 5G. The circuit device 20 according to the present embodiment can be used for a variety of apparatuses such as a base station, a remote radio head (RRH), or a portable communication terminal for the next-generation mobile communication system. In the next-generation mobile communication system, there is demanded a highly accurate clock frequency for time synchronization and so on, and therefore, the next-generation mobile communication system is suitable as an application example of the circuit device 20 according to the present embodiment capable of generating the highly accurate clock signal.

The communication interface 510 performs a process of receiving data from the outside and transmitting data to the outside via the antenna ANT. The processing device 520 as a processor performs a control process for the electronic apparatus 500, a variety of types of digital processing of the data transmitted or received via the communication interface 510, and so on. The function of the processing device 520 can be realized by a processor such as a microcomputer. The operation interface 530 is for the user to perform an input operation, and can be realized by operation buttons, a touch panel display, or the like. The display section 540 is for displaying a variety of types of information, and can be realized by a display using a liquid crystal, an organic EL, or the like. The memory 550 is for storing the data, and the function thereof can be realized by a semiconductor memory such as a RAM or a ROM.

Figure 16:
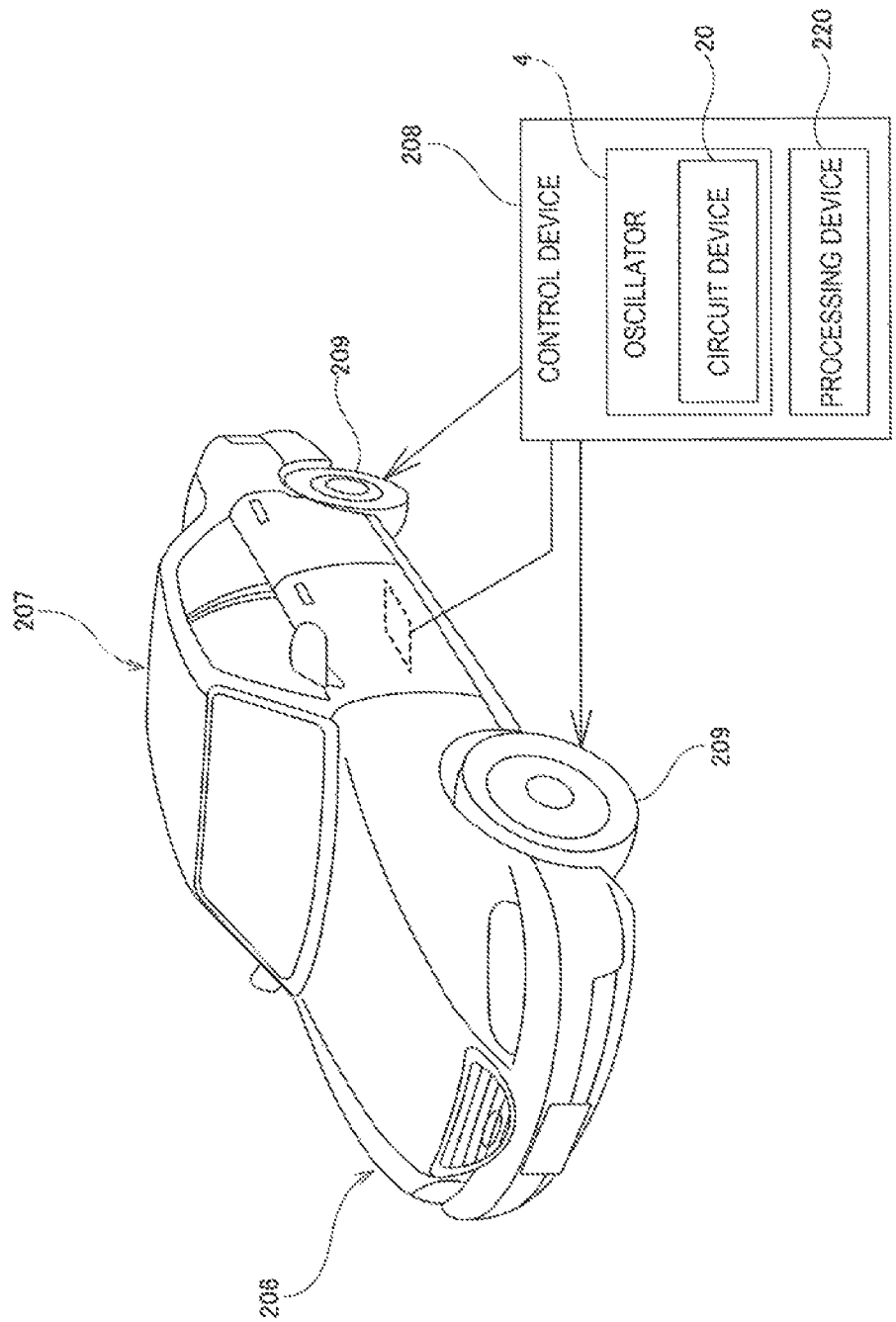
FIG. 16 is a diagram showing an example of a vehicle.

FIG. 16 shows an example of a vehicle including the circuit device 20 according to the present embodiment. The vehicle includes the circuit device 20 according to the present embodiment and a processing device 220 which operates using the clock signal based on the oscillation signal of the oscillation circuit 30 of the circuit device 20. Specifically, the vehicle includes the oscillator 4 having the circuit device 20 according to the present embodiment, and the processing device 220 operates based on the clock signal from the oscillator 4. The circuit device 20 according to the present embodiment can be incorporated in a variety of vehicles such as a car, an airplane, a motorbike, a bicycle, a ship, or a boat. The vehicle is equipment or a device which is provided with a drive mechanism such as an engine or an electric motor, a steering mechanism such as a steering wheel or a helm, and a variety of electronic apparatuses, and moves on the ground, in the air, or on the sea. FIG. 16 schematically shows a car 206 as a specific example of the vehicle. The car 206 incorporates the circuit device 20 according to the present embodiment. Specifically, the car 206 as the vehicle includes a control device 208, and the control device 208 includes the oscillator 4 including the circuit device 20 according to the present embodiment, and the processing device 220 which operates based on the clock signal generated by the oscillator 4. The control device 208 controls the stiffness of the suspension in accordance with, for example, the attitude of a car body 207, and controls the brake of each of the wheels 209. For example, it is also possible to realize automated driving of the car 206 using the control device 208. It should be noted that the apparatus incorporating the circuit device 20 according to the present embodiment is not limited to such a control device 208, but the circuit device 20 according to the present embodiment can be incorporated in a variety of types of in-car equipment such as meter panel equipment or navigation equipment provided to a vehicle such as the car 206.

As described hereinabove, the circuit device according to the present embodiment includes the current generation circuit and the current-voltage conversion circuit. The current generation circuit generates a temperature compensation current based on a temperature detection voltage from the temperature sensor and temperature compensation data. The current-voltage conversion circuit converts the temperature compensation current into the temperature compensation voltage. The current generation circuit performs a fine adjustment of the temperature compensation current based on lower bits of the temperature compensation data, and performs a coarse adjustment of the temperature compensation current based on higher bits of the temperature compensation data.

According to the present embodiment, the adjustment of the temperature compensation current based on the temperature compensation data is separated into the coarse adjustment based on the higher bits and the fine adjustment based on the lower bits. Thus, it is possible to achieve both of the reduction in size of the circuit and the high adjustment resolution. In other words, by separating the coarse adjustment and the fine adjustment from each other, it is possible to achieve the high resolution by the fine adjustment circuit while making the coarse adjustment circuit compact.

Further, in the present embodiment, the current generation circuit may include a high-order function current generation circuit. The high-order function current generation circuit may generate a second or higher-order function current as a high-order function current based on the temperature detection voltage and the high-order correction data of the temperature compensation data. The high-order function current generation circuit may perform a fine adjustment of the high-order function current based on high-order lower bits as lower bits of the high-order correction data, and perform a coarse adjustment of the high-order function current based on high-order higher bits as higher bits of the high-order correction data.

According to the present embodiment, the adjustment of the high-order function current is separated into the coarse adjustment and the fine adjustment. Thus, it is possible to achieve both of the reduction in size of the circuit and the high adjustment resolution in the high-order function current generation circuit. In other words, in the high-order function current generation circuit, by separating the coarse adjustment and the fine adjustment from each other, it is possible to achieve the high resolution by the fine adjustment circuit while making the coarse adjustment circuit compact.

Further, in the present embodiment, the high-order function current generation circuit may include a function generation circuit and a high-order current mirror circuit. The function generation circuit may generate a mirror input function current as a current approximating the function with respect to the temperature based on the temperature detection voltage. The high-order current mirror circuit may mirror a mirror input function current to output the high-order function current. The high-order current mirror circuit may have a first high-order transistor, a second high-order transistor, and a high-order fine adjustment circuit. Through the first high-order transistor, the mirror input function current may flow. The second high-order transistor may mirror the mirror input function current flowing through the first high-order transistor. The high-order fine adjustment circuit may adjust a back gate voltage of the second high-order transistor based on the high-order lower bits to adjust a current mirror ratio of the second high-order transistor.

According to the present embodiment, by the high-order fine adjustment circuit adjusting the back gate voltages of the first high-order transistor and the second high-order transistor based on the high-order lower bits, it is possible to perform the fine adjustment of the high-order function current in accordance with the high-order lower bits.

Further, in the present embodiment, the high-order current mirror circuit may include a high-order coarse adjustment circuit. The high-order coarse adjustment circuit may mirrors the mirror input function current flowing through the first high-order transistor at the current mirror ratio based on the high-order higher bits.

According to the present embodiment, by the high-order coarse adjustment circuit mirroring the mirror input function current at the current mirror ratio based on the high-order higher bits, it is possible to perform the coarse adjustment of the high-order function current in accordance with the high-order higher bits.

Further, in the present embodiment, the high-order coarse adjustment circuit may have first through n-th coarse adjusting transistors (n is an integer not smaller than 2) and first through n-th coarse adjusting switches. The first through n-th coarse adjusting switches may respectively be disposed between gates of the first through n-th coarse adjusting transistors and a gate of the first high-order transistor.

By adopting this configuration, by the first through n-th coarse adjusting switches being set to the on state or the off state based on the high-order higher bits, the current mirror ratio based on the high-order higher bits is set. Thus, it is possible for the high-order coarse adjustment circuit to mirror the mirror input function current at the current mirror ratio based on the high-order higher bits.

Further, in the present embodiment, the current generation circuit may include a linear function current generation circuit. The linear function current generation circuit may generate a linear function current based on the temperature detection voltage and first-order correction data of the temperature compensation data. The linear function current generation circuit may perform a fine adjustment of the linear function current based on first-order lower bits as lower bits of the first-order correction data, and perform a coarse adjustment of the linear function current based on first-order higher bits as higher bits of the first-order correction data.

According to the present embodiment, the adjustment of the linear function current is separated into the coarse adjustment and the fine adjustment. Thus, it is possible to achieve both of the reduction in size of the circuit and the high adjustment resolution in the linear function current generation circuit. In other words, in the linear function current generation circuit, by separating the coarse adjustment and the fine adjustment from each other, it is possible to achieve the high resolution by the fine adjustment circuit while making the coarse adjustment circuit compact.

Further, in the present embodiment, the linear function current generation circuit may include a non-inverting amplifier circuit and a first-order coarse adjustment circuit. The non-inverting amplifier circuit may have an operational amplifier and a first-order fine adjustment circuit to amplify the temperature detection voltage. The first-order fine adjustment circuit may be a first variable resistive circuit to be electrically coupled to an output node of the operational amplifier, an inverting input node of the operational amplifier, and a ground node. The first-order fine adjustment circuit may adjust a ratio between a first resistance value between the output node of the operational amplifier and the inverting input node of the operational amplifier, and a second resistance value between the inverting input node of the operational amplifier and the ground node based on the first-order lower bits. The first-order coarse adjustment circuit may be a second variable resistive circuit to electrically be coupled between an output node of the non-inverting amplifier circuit and an input node of the current-voltage conversion circuit. The first-order coarse adjustment circuit may adjust a resistance value between the output node of the non-inverting amplifier circuit and the input node of the current-voltage conversion circuit based on the first-order higher bits.

According to the present embodiment, by the first-order fine adjustment circuit adjusting the ratio between the first resistance value and the second resistance value based on the first-order lower bits, it is possible to adjust a gain of the non-inverting amplifier circuit. Thus, it is possible for the first-order fine adjustment circuit to perform the fine adjustment of the linear function current based on the first-order lower bits. Further, by the first-order coarse adjustment circuit adjusting the resistance value between the output node of the non-inverting amplifier circuit and the input node of the current-voltage conversion circuit based on the first-order higher bits, it is possible to perform the coarse adjustment of the linear function current based on the first-order higher bits.

Further, in the present embodiment, the circuit device may include a temperature sensor. The temperature sensor may output a temperature detection voltage based on zero-order correction data of the temperature compensation data. The temperature sensor may perform a coarse adjustment of an offset of the temperature detection voltage based on zero-order higher bits as higher bits of zero-order correction data, and perform a fine adjustment of the offset of the temperature detection voltage based on zero-order lower bits as lower bits of the zero-order correction data.

According to the present embodiment, the offset adjustment of the temperature detection voltage is separated into the coarse adjustment and the fine adjustment. Thus, it is possible to achieve both of the reduction in size of the circuit for adjusting the offset of the temperature detection voltage and the high adjustment resolution. In other words, in the offset adjustment of the temperature detection voltage, by separating the coarse adjustment and the fine adjustment from each other, it is possible to achieve the high resolution by the zero-order fine adjustment circuit while making the zero-order coarse adjustment circuit compact.

Further, in the present embodiment, the temperature sensor may include a bipolar transistor, a buffer circuit, and the zero-order fine adjustment circuit. The buffer circuit may buffer an output voltage from a first collector node as a collector node of the bipolar transistor to output the temperature detection voltage. The buffer circuit may have a differential section. The differential section may include a zero-order current mirror circuit, and a differential pair to electrically be coupled to the zero-order current mirror circuit. The zero-order current mirror circuit may be constituted by a first zero-order transistor and a second zero-order transistor. The differential pair may be constituted by a first differential pair transistor and a second differential pair transistor. The output voltage from the first collector node may be input to a base node of the first differential pair transistor, and an output node of the buffer circuit may electrically be coupled to a base node of the second differential pair transistor. The zero-order fine adjustment circuit may control at least one of a back gate voltage of the first zero-order transistor and a back gate voltage of the second zero-order transistor based on zero-order lower bits.

According to the present embodiment, by the zero-order fine adjustment circuit controlling at least one of the back gate voltage of the first zero-order transistor and the back gate voltage of the second zero-order transistor based on the zero-order lower bits, it is possible to adjust the offset voltage of the buffer circuit. Thus, it is possible for the zero-order fine adjustment circuit to perform the fine adjustment of the offset of the temperature detection voltage based on the zero-order lower bits.

Further, in the present embodiment, the temperature sensor may include a resistor and the zero-order coarse adjustment circuit. The resistor may be disposed between a first node electrically coupled to a first base node as a base node of the bipolar transistor, and the first collector node. The zero-order coarse adjustment circuit may be a variable resistive circuit disposed between a first emitter node as an emitter node of the bipolar transistor and the ground node. The zero-order coarse adjustment circuit may adjust a resistance value between the first emitter node and the ground node based on the zero-order higher bits.

According to the present embodiment, by the zero-order coarse adjustment circuit adjusting the resistance value between the first emitter node and the ground node based on the zero-order higher bits, it is possible to adjust an output voltage output from the first collector node. The buffer circuit buffers the output voltage to thereby output the temperature detection voltage. Thus, it is possible for the zero-order coarse adjustment circuit to perform the coarse adjustment of the offset of the temperature detection voltage based on the zero-order higher bits.

Further, the circuit device according to the present embodiment may include an oscillation circuit configured to oscillate a resonator. The temperature compensation voltage may be a voltage for performing the temperature compensation of the oscillation frequency of the oscillation circuit.

Further, an oscillator according to the present embodiment includes any one of the circuit devices described above, and a resonator.

Further, an electronic apparatus according to the present embodiment includes any one of the circuit devices described above, and a processing device which operates based on an output signal from the circuit device.

Further, a vehicle according to the present embodiment includes any one of the circuit devices described above, and a processing device which operates based on an output signal from the circuit device.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with the different term in any part of the specification or the accompanying drawings. Further, all of the combinations of the present embodiment and the modified examples are also included in the scope of the present disclosure. Further, the configurations and the operations of the circuit device, the oscillator, the electronic apparatus, and the vehicle are not limited to those described in the present embodiment, but can be implemented with a variety of modifications.

What is claimed is:

1. A circuit device comprising:
   a current generation circuit configured to generate a temperature compensation current based on a temperature detection voltage from a temperature sensor and temperature compensation data; and
   a current-voltage conversion circuit configured to convert the temperature compensation current into a temperature compensation voltage, wherein
   the current generation circuit performs a fine adjustment of the temperature compensation current based on lower bits of the temperature compensation data, and performs a coarse adjustment of the temperature compensation current based on higher bits of the temperature compensation data,
   the current generation circuit includes a high-order function current generation circuit configured to generate a second or higher-order function current based on the temperature detection voltage and high-order correction data of the temperature compensation data, and
   the high-order function current generation circuit performs a fine adjustment of the high-order function current based on high-order lower bits as lower bits of the high-order correction data, and performs a coarse adjustment of the high-order function current based on high-order higher bits as higher bits of the high order correction data.

2. The circuit device according to claim 1, wherein
   the high-order function current generation circuit includes
   a function generation circuit configured to generate a mirror input function current as a current approximating a function with respect to a temperature based on the temperature detection voltage, and a high-order current mirror circuit configured to mirror the mirror input function current to output the high-order function current, and the high-order current mirror circuit includes
- a first high-order transistor through which the mirror input function current flows,
- a second high-order transistor configured to mirror the mirror input function current flowing through the first high-order transistor, and
- a high-order fine adjustment circuit configured to adjust a back gate voltage of the second high-order transistor based on the high-order lower bits to adjust a current mirror ratio of the second high-order transistor.

3. The circuit device according to claim 2, wherein
the high-order current mirror circuit includes a high-order coarse adjustment circuit configured to mirror the mirror input function current flowing through the first high-order transistor at a current mirror ratio based on the high-order higher bits.

4. The circuit device according to claim 3, wherein
the high-order coarse adjustment circuit includes
- first through n-th coarse adjusting transistors, n being an integer not smaller than 2, and
- first through n-th coarse adjusting switches respectively disposed between gates of the first through n-th coarse adjusting transistors and a gate of the first high-order transistor.

5. The circuit device according to claim 1 further comprising:
an oscillation circuit configured to oscillate a resonator, wherein
the temperature compensation voltage is a voltage used to perform temperature compensation of a oscillation frequency of the oscillation circuit.

6. An oscillator comprising:
the circuit device according to claim 5; and
the resonator.

7. An electronic apparatus comprising:
the circuit device according to claim 1; and
a processing device which operates based on an output signal from the circuit device.

8. A vehicle comprising:
the circuit device according to claim 1; and
a processing device which operates based on an output signal from the circuit device.

9. A circuit device comprising:
a current generation circuit configured to generate a temperature compensation current based on a temperature detection voltage from a temperature sensor and temperature compensation data; and
a current-voltage conversion circuit configured to convert the temperature compensation current into a temperature compensation voltage, wherein
the current generation circuit performs a fine adjustment of the temperature compensation current based on lower bits of the temperature compensation data, and performs a coarse adjustment of the temperature compensation current based on higher bits of the temperature compensation data,
the current generation circuit includes a linear function current generation circuit configured to generate a linear function current based on the temperature detection voltage and first-order correction data of the temperature compensation data, and
the linear function current generation circuit performs a fine adjustment of the linear function current based on first-order lower bits as lower bits of the first-order correction data, and performs a coarse adjustment of the linear function current based on first-order higher bits as higher bits of the first-order correction data.

10. The circuit device according to claim 9, wherein
the linear function current generation circuit includes
- a non-inverting amplifier circuit which has an operational amplifier and a first-order fine adjustment circuit, and is configured to amplify the temperature detection voltage, and
- a first-order coarse adjustment circuit,
the first-order fine adjustment circuit is a first variable resistive circuit electrically coupled to an output node of the operational amplifier, an inverting input node of the operational amplifier, and a ground node, and adjusts a ratio between a first resistance value between the output node of the operational amplifier and the inverting input node of the operational amplifier, and a second resistance value between the inverting input node of the operational amplifier and the ground node based on the first-order lower bits, and
the first-order coarse adjustment circuit is a second variable resistive circuit electrically coupled between an output node of the non-inverting amplifier circuit and an input node of the current-voltage conversion circuit, and adjusts a resistance value between the output node of the non-inverting amplifier circuit and the input node of the current-voltage conversion circuit based on the first-order higher bits.

11. A circuit device comprising:
a current generation circuit configured to generate a temperature compensation current based on a temperature detection voltage from a temperature sensor and temperature compensation data; and
a current-voltage conversion circuit configured to convert the temperature compensation current into a temperature compensation voltage, wherein
the current generation circuit performs a fine adjustment of the temperature compensation current based on lower bits of the temperature compensation data, and performs a coarse adjustment of the temperature compensation current based on higher bits of the temperature compensation data,
the temperature sensor is configured to output the temperature detection voltage based on zero-order correction data of the temperature compensation data, and
the temperature sensor performs a coarse adjustment of an offset of the temperature detection voltage based on zero-order higher bits as higher bits of the zero-order correction data, and performs a fine adjustment of the offset of the temperature detection voltage based on zero-order lower bits as lower bits of the zero-order correction data.

12. The circuit device according to claim 11, wherein
the temperature sensor includes
- a bipolar transistor,
- a buffer circuit configured to buffer an output voltage from a first collector node as a collector node of the bipolar transistor to output the temperature detection voltage, and
- a zero-order fine adjustment circuit,
the buffer circuit includes a differential section having a zero-order current mirror circuit, and a differential pair to electrically be coupled to the zero-order current mirror circuit, the zero-order current mirror circuit is constituted by a first zero-order transistor and a second zero-order transistor, the differential pair is constituted by a first differential pair transistor and a second differential pair transistor, the output voltage from the first collector node is input to a base node of the first differential pair transistor, and an output node of the buffer circuit is electrically coupled to a base node of the second differential pair transistor, and the zero-order fine adjustment circuit controls at least one of a back gate voltage of the first zero-order transistor and a back gate voltage of the second zero-order transistor based on the zero-order lower bits.

13. The circuit device according to claim 12, wherein the temperature sensor includes a resistor disposed between a first node electrically coupled to a first base node as a base node of the bipolar transistor, and the first collector node, and a zero-order coarse adjustment circuit, and the zero-order coarse adjustment circuit is a variable resistive circuit disposed between a first emitter node as an emitter node of the bipolar transistor and a ground node, and adjusts a resistance value between the first emitter node and the ground node based on the zero-order higher bits.

\* \* \* \* \*